(12) United States Patent
Kim et al.

(10) Patent No.: US 11,765,957 B2
(45) Date of Patent: Sep. 19, 2023

(54) DISPLAY DEVICE AND METHOD OF MANUFACTURING THE SAME

(71) Applicant: Samsung Display Co., Ltd., Yongin-si (KR)

(72) Inventors: Youn Joon Kim, Yongin-si (KR); Eun-Sook Jung, Yongin-si (KR); Jonghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/954,202

(22) Filed: Sep. 27, 2022

(65) Prior Publication Data
US 2023/0106333 A1 Apr. 6, 2023

(30) Foreign Application Priority Data
Oct. 1, 2021 (KR) ........................ 10-2021-0130566

(51) Int. Cl.
| | |
|---|---|
| H10K 59/40 | (2023.01) |
| G06F 3/044 | (2006.01) |
| H10K 59/38 | (2023.01) |
| H10K 59/122 | (2023.01) |
| H10K 71/00 | (2023.01) |
| H10K 59/12 | (2023.01) |

(52) U.S. Cl.
CPC .......... *H10K 59/40* (2023.02); *G06F 3/0445* (2019.05); *H10K 59/122* (2023.02); *H10K 59/38* (2023.02); *H10K 71/00* (2023.02); *G06F 2203/04111* (2013.01); *G06F 2203/04112* (2013.01); *H10K 59/1201* (2023.02)

(58) Field of Classification Search
CPC ....... G06F 3/044; G06F 3/0445; H10K 59/40; H10K 59/122; H10K 59/38
See application file for complete search history.

(56) References Cited

U.S. PATENT DOCUMENTS

| | | |
|---|---|---|
| 11,150,753 B2 | 10/2021 | Lee et al. |
| 2018/0006267 A1* | 1/2018 | Sakamoto ............ H10K 77/111 |

(Continued)

FOREIGN PATENT DOCUMENTS

| | | |
|---|---|---|
| KR | 10-2020-0145908 A | 12/2020 |
| KR | 10-2021-0026451 A | 3/2021 |

*Primary Examiner* — Kevin M Nguyen
(74) *Attorney, Agent, or Firm* — Lewis Roca Rothgerber Christie LLP

(57) ABSTRACT

A display device includes: a display panel comprising a light emitting area and a non-light-emitting area; an input sensor on the display panel; and an anti-reflective layer on the input sensor, the input sensor comprising: a sensing electrode on the display panel and having a first opening defined therethrough to correspond to the light emitting area; a first insulating layer between the sensing electrode and the display panel and having a second opening defined therethrough to correspond to the first opening; and a second insulating layer comprising a first portion inside at least the first opening and the second opening, wherein one of the first insulating layer and the second insulating layer comprises an organic material, the other of the first insulating layer and the second insulating layer comprises an inorganic material, and the first opening has a substantially same shape as the second opening in a plan view.

20 Claims, 18 Drawing Sheets

(56) References Cited

U.S. PATENT DOCUMENTS

2019/0278145 A1 9/2019 Tanaka et al.
2019/0346711 A1* 11/2019 Yeh ..................... G02F 1/1368
2021/0064188 A1 3/2021 Lee et al.
2021/0126227 A1 4/2021 Choi et al.
2021/0200363 A1* 7/2021 Lee ..................... H10K 59/121

* cited by examiner

DISPLAY DEVICE AND METHOD OF MANUFACTURING THE SAME

CROSS-REFERENCE TO RELATED APPLICATION

The present application claims priority to and the benefit of Korean Patent Application No. 10-2021-0130566, filed on Oct. 1, 2021, the entire content of which is hereby incorporated by reference.

BACKGROUND

1. Field

Aspects of some embodiments of the present disclosure relate to a display device and a method of manufacturing the same.

2. Description of the Related Art

Various display devices applied to multimedia devices, such as televisions, mobile phones, tablet computers, computers, navigation devices, and game devices, are being developed. Display devices may include a keyboard, a mouse, or a remote controller as their input device. In addition, display devices may include an input sensor as an input device.

In recent years, a bendable display device, a curved display device, a foldable display device, and a rollable display device are being developed.

The above information disclosed in this Background section is only for enhancement of understanding of the background and therefore the information discussed in this Background section does not necessarily constitute prior art.

SUMMARY

Aspects of some embodiments of the present disclosure relate to a display device and a method of manufacturing the same. For example, aspects of some embodiments according to the present disclosure relate to a foldable display device and a method of manufacturing the foldable display device.

Aspects of some embodiments of the present disclosure include an input sensor capable of improving folding characteristics and preventing or reducing instances of an insulating layer being damaged.

Aspects of some embodiments of the present disclosure include a display device including the input sensor.

Aspects of some embodiments of the present disclosure include a display device including a display panel including a light emitting area and a non-light-emitting area, an input sensor on the display panel, and an anti-reflective layer on the input sensor. The input sensor includes a sensing electrode on the display panel and provided with a first opening defined therethrough to correspond to the light emitting area, a first insulating layer between the sensing electrode and the display panel and provided with a second opening defined therethrough to correspond to the first opening, and a second insulating layer including a first portion inside at least the first opening and the second opening. One of the first insulating layer and the second insulating layer includes an organic material, the other of the first insulating layer and the second insulating layer includes an inorganic material, and the first opening has a substantially same shape as the second opening in a plan view.

According to some embodiments, an upper surface of the second insulating layer protrudes from an upper surface of the sensing electrode to form a step difference with the upper surface of the sensing electrode.

According to some embodiments, the display device further includes a light blocking pattern that covers the step difference and is in contact with the sensing electrode.

According to some embodiments, the display device further includes a color filter layer on an upper surface of the second insulating layer and overlapping the light emitting area and the non-light-emitting area.

According to some embodiments, the second insulating layer further includes a second portion extending from the first portion and overlapping the light emitting area and the non-light-emitting area.

According to some embodiments, the second portion of the second insulating layer covers the sensing electrode.

According to some embodiments, the display device further includes a color filter layer on the second insulating layer.

According to some embodiments, the display device further includes a lower insulating layer between the display panel and the first and second insulating layers and overlapping the light emitting area and the non-light-emitting area.

According to some embodiments, the display device further includes a bridge electrode between the lower insulating layer and the first insulating layer, and the bridge electrode is connected to the sensing electrode via a contact hole defined through the first insulating layer.

According to some embodiments, the display device further includes a lower insulating layer between the display panel and the first insulating layer and provided with a third opening defined therethrough and extending from the second opening.

According to some embodiments, a side surface of the sensing electrode is aligned with a side surface of the first insulating layer.

According to some embodiments, the sensing electrode has a mesh shape in a plan view.

According to some embodiments, the display panel includes a light emitting element including a first electrode, a light emitting layer on the first electrode, and a second electrode on the light emitting layer, a pixel definition layer provided with a pixel emitting opening defined therethrough to expose the first electrode, and an encapsulation layer on the pixel definition layer and encapsulating the light emitting element, and the light emitting opening defines the light emitting area.

Aspects of some embodiments of the present disclosure include a method of manufacturing a display device. The method includes forming a first insulating layer on a display panel including a light emitting area and a non-light-emitting area, forming a sensing electrode provided with a first opening defined therethrough on the first insulating layer, forming a second opening having a same shape as the first opening in a plan view through the first insulating layer using the sensing electrode as a mask, forming a second insulating layer including a first portion inside at least the first and second openings, and forming a color filter layer on the second insulating layer to overlap the light emitting area and the non-light-emitting area. One of the first insulating layer and the second insulating layer includes an organic material, and the other of the first insulating layer and the second insulating layer includes an inorganic material.

According to some embodiments, the forming of the second insulating layer includes forming the second insulating layer to cover the sensing electrode and the first insulating layer and patterning the second insulating layer to expose an upper surface of the sensing electrode without being covered by the second insulating layer.

According to some embodiments, the method further includes forming a light blocking pattern to overlap an upper surface of the sensing electrode after the forming of the second insulating layer and before the forming of the color filter layer.

According to some embodiments, the second insulating layer further includes a second portion extending from the first portion and overlapping the light emitting area and the non-light-emitting area, and the forming of the second insulating layer includes depositing an insulating material.

According to some embodiments, the method further includes forming a lower insulating layer overlapping the light emitting area and the non-light-emitting area before the forming of the first insulating layer.

According to some embodiments, the method further includes forming a third opening defined through the lower insulating layer and extending from the second opening after the forming of the second opening through the first insulating layer.

According to some embodiments, a side surface of the first insulating layer is aligned with a side surface of the sensing electrode.

According to some embodiments of the present disclosure, the insulating layer of the input sensor may include both the organic layer and the inorganic layer.

Thus, the folding characteristics of the input sensor may be relatively improved, and the damage of the input sensor caused by external impacts may be prevented or relatively reduced compared to alternative configurations.

BRIEF DESCRIPTION OF THE DRAWINGS

The above and other characteristics of some embodiments according to the present disclosure will become more readily apparent by reference to the following detailed description when considered in conjunction with the accompanying drawings wherein.

DETAILED DESCRIPTION

Figure 1A:
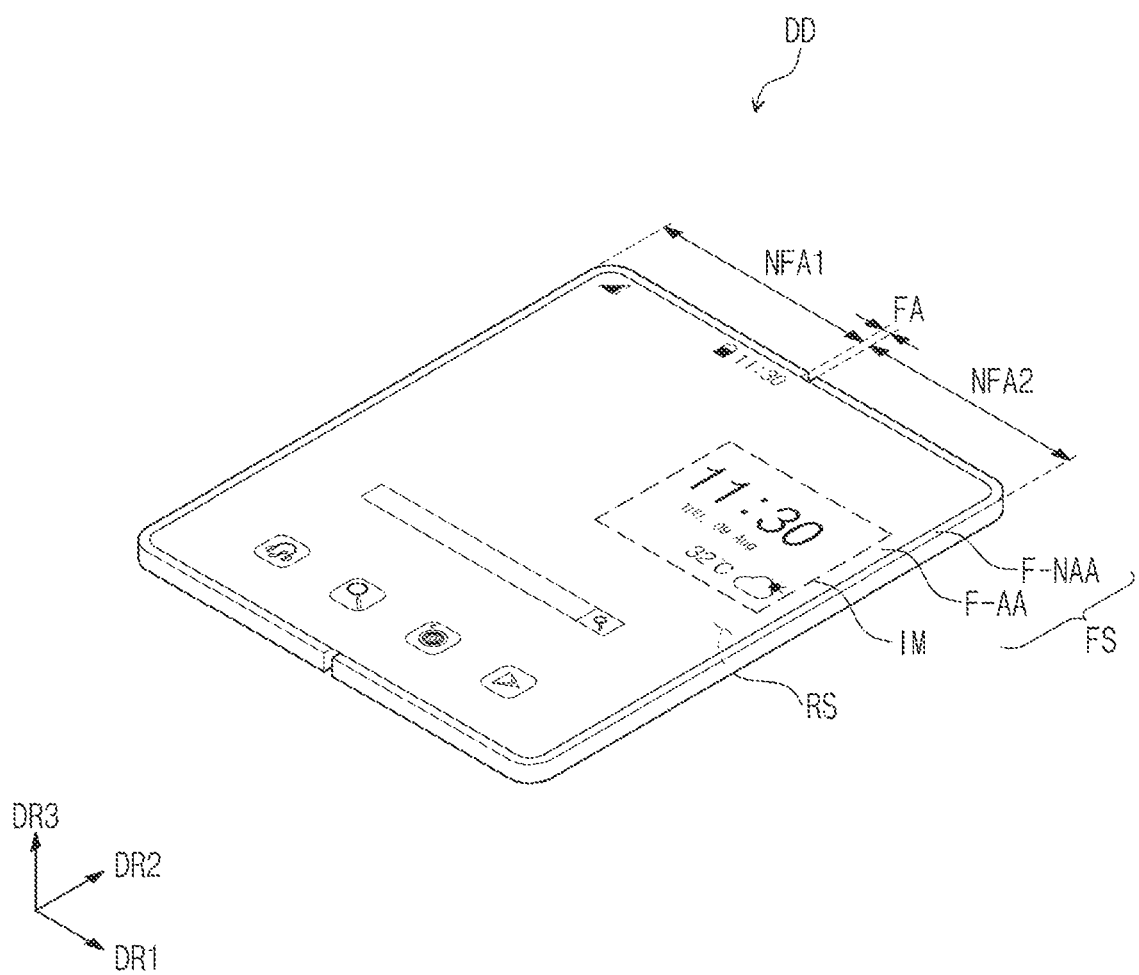
FIG. 1A is a perspective view of a display device in an unfolded state according to some embodiments of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

Figure 1B:
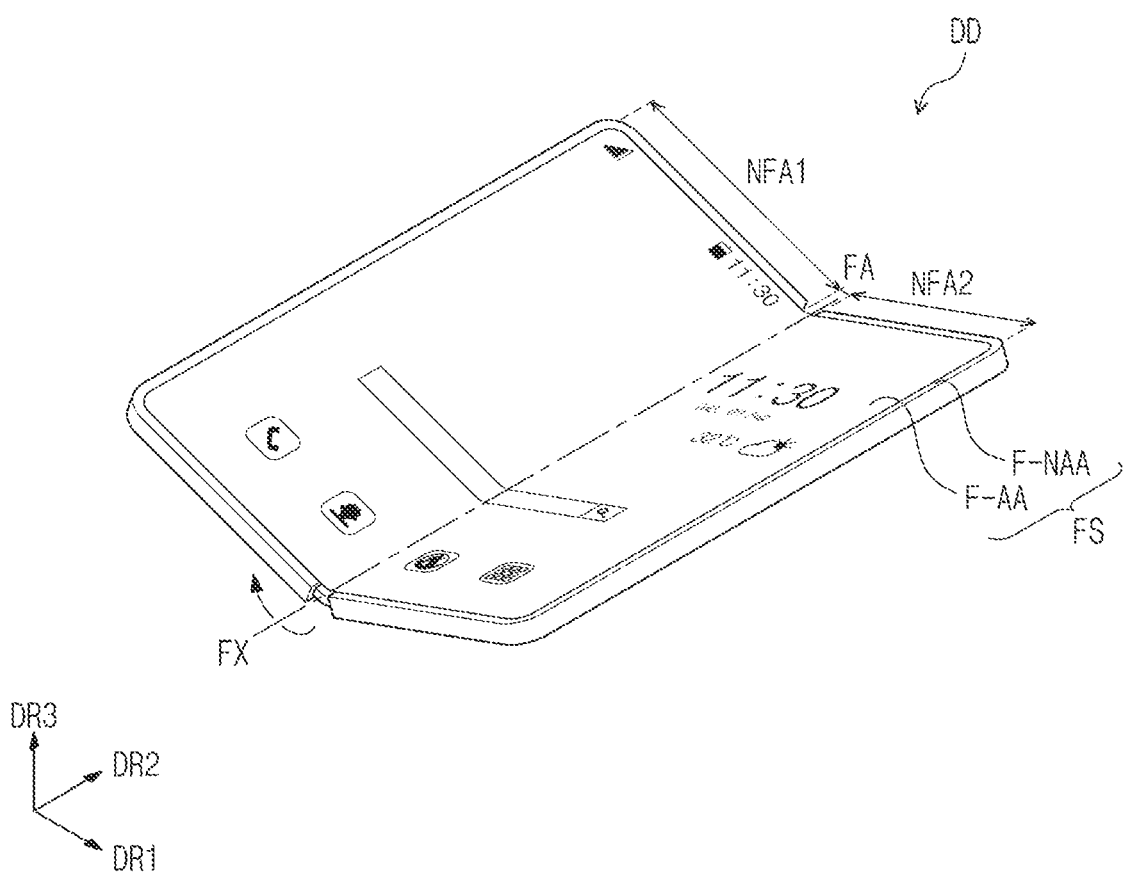
FIG. 1B is a perspective view of a folding operation of a display device according to some embodiments of the present disclosure.
Figure 1C:
FIG. 1C is a plan view of a display device in a folded state according to some embodiments of the present disclosure.
Figure 1D:
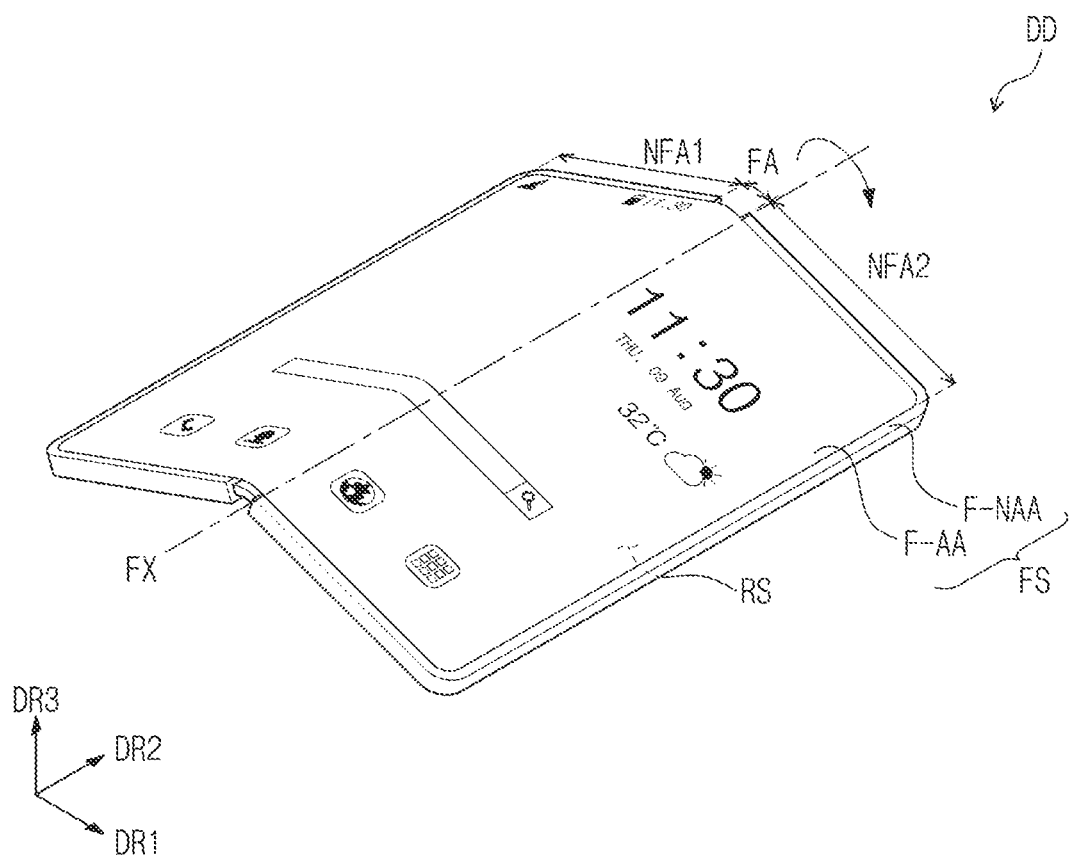
FIG. 1D is a perspective view of a folding operation of a display device according to some embodiments of the present disclosure.

FIG. 1A is a perspective view of a display device DD in an unfolded state according to some embodiments of the present disclosure. FIG. 1B is a perspective view of a folding operation of the display device DD according to some embodiments of the present disclosure. FIG. 1C is a plan view of the display device DD in a folded state according to some embodiments of the present disclosure. FIG. 1D is a perspective view of a folding operation of the display device DD according to some embodiments of the present disclosure.

Referring to FIG. 1A, the display device DD may be a device activated in response to electrical signals. The display device DD may include various embodiments. A smartphone is shown as a representative example of the display device DD, however, the display device DD may include various electronic items or devices according to various embodiments, such as a tablet computer, a notebook computer, a computer, or a smart television.

The display device DD may display one or more images IM at a first display surface FS that is parallel (or substantially parallel) to each of a first direction DR1 and a second direction DR2 toward a third direction DR3. The first display surface FS through which the image IM is displayed may correspond to a front surface of the display device DD. The image IM may include a video (or moving image) and a still (or static) image. FIG. 1A shows an internet search box and a clock widget as an example of the image IM, but the image IM may vary according to the design and use of the display device DD.

According to some embodiments, front (or upper) and rear (or lower) surfaces of each member of the display device DD may be defined with respect to a direction in which the image IM is displayed. The front and rear surfaces may be opposite to each other in the third direction DR3, and a normal line direction of each of the front and rear surfaces may be parallel (or substantially parallel) to the third direction DR3.

A separation distance between the front surface and the rear surface in the third direction DR3 may correspond to a thickness or a height of the display device DD in the third direction DR3. Meanwhile, directions indicated by the first, second, and third directions DR1, DR2, and DR3 may be relative to each other and may be changed to other directions.

The display device DD may sense an external input applied thereto from an outside. The external input may include various forms of inputs provided from the outside of the display device DD. For example, the external inputs may include a proximity input (e.g., a hovering input) applied when approaching close to or adjacent to the display device DD at a distance (e.g., a set or predetermined distance) as well as a touch input by a user's body part (e.g., a user's hand). In addition, the external inputs may be provided in the form of force, pressure, temperature, light, etc.

According to some embodiments, the display device DD may include the first display surface FS. The first display surface FS may include a first display area F-AA and a first non-display area F-NAA. The first display area F-AA may be activated in response to the electrical signals. The image IM may be displayed through the first display area F-AA, and various external inputs may be sensed through the first display area F-AA. The first non-display area F-NAA may be defined adjacent to the first display area F-AA. The first non-display area F-NAA may have a color (e.g., a set or predetermined color). The first non-display area F-NAA may surround the first display area F-AA. Accordingly, a shape of the first display area F-AA may be substantially defined by the first non-display area F-NAA, however, this is merely one example. The first non-display area F-NAA may be defined adjacent to only one side of the first display area F-AA or may be omitted.

The display device DD may include at least one folding area FA and a plurality of non-folding areas NFA1 and NFA2 extending from the folding area FA. The non-folding areas NFA1 and NFA2 may include a first non-folding area NFA1 and a second non-folding area NFA2, which are spaced apart from each other in the first direction DR1 with the folding area FA interposed therebetween.

Referring to FIG. 1B, the display device DD may be folded with respect to a folding axis FX that is an imaginary line and extends in the second direction DR2. The display device DD may be folded with respect to the folding axis FX to be in an in-folding state where the first non-folding area NFA1 of the first display surface FS faces the second non-folding area NFA2 of the first display surface FS.

Referring to FIG. 1C, a second display surface RS may be viewed by a user during the in-folding state of the display device DD. In this case, the second display surface RS may include a second display area R-AA at which images may be displayed. The second display area R-AA may be activated in response to electrical signals. The second display area R-AA may be an area at which images may be displayed and various external inputs are sensed.

A second non-display area R-NAA may be defined adjacent to the second display area R-AA. The second non-display area R-NAA may have a color (e.g., a set or predetermined color). The second non-display area R-NAA may surround the second display area R-AA. In addition, according to some embodiments, the second display surface RS may further include an electronic module area in which an electronic module including various components is located, and the second display surface RS should not be particularly limited.

Referring to FIG. 1D, the display device DD may be folded with respect to the folding axis FX to be in an out-folding state where the first non-folding area NFA1 of the second display surface RS faces the second non-folding area NFA2 of the second display surface RS.

However, the display device DD is not limited thereto or thereby. The display device DD may be folded with respect to a plurality of folding axes such that a portion of the first display surface FS and a portion of the second display surface RS face each other, and the number of the folding axes and the number of non-folding areas should not be particularly limited.

Figure 2:
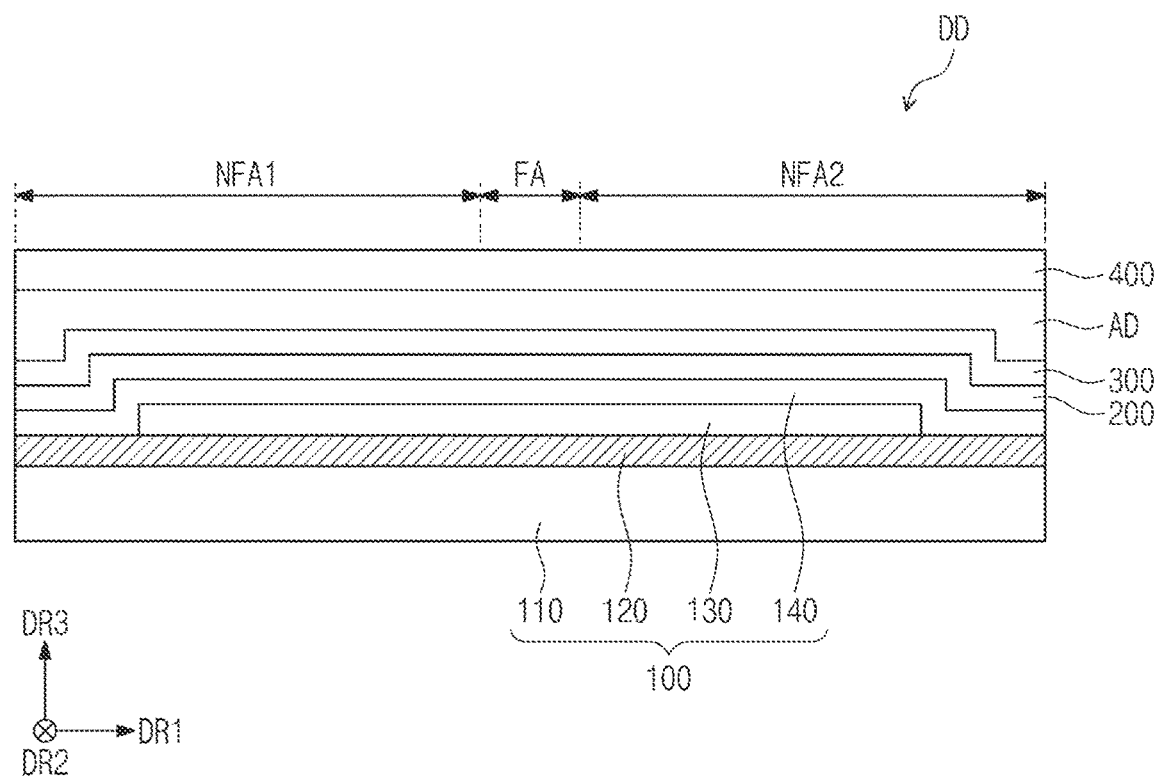
FIG. 2 is a cross-sectional view of a display device according to some embodiments of the present disclosure.

FIG. 2 is a cross-sectional view of the display device DD according to some embodiments of the present disclosure. Referring to FIG. 2, the display device DD may include a display panel 100, an input sensor 200, an anti-reflective layer 300, and a window 400.

The display panel 100 may be a light emitting type display panel. For example, the display panel 100 may be an organic light emitting display panel, an inorganic light emitting display panel, a micro-LED display panel, or a nano-LED display panel. The display panel 100 may include a base layer 110, a circuit layer 120, a light emitting element layer 130, and an encapsulation layer 140.

The base layer 110 may provide a base surface on which the circuit layer 120 is located. The base layer 110 may be a flexible substrate that is foldable. The base layer 110 may be a glass substrate, a metal substrate, or a polymer substrate, however, it should not be limited thereto or thereby, and the base layer 110 may include any suitable substrate material. According to some embodiments, the base layer 110 may be an inorganic layer, an organic layer, or a composite material layer.

The base layer 110 may have a multi-layer structure. For instance, the base layer 110 may include a first synthetic resin layer, an inorganic layer having a single-layer or multi-layer structure, and a second synthetic resin layer located on the inorganic layer having the single-layer or multi-layer structure. Each of the first and second synthetic resin layers may include a polyimide-based resin, however, it should not be particularly limited.

The circuit layer 120 may be located on the base layer 110. The circuit layer 120 may include an insulating layer, a semiconductor pattern, a conductive pattern, and a signal line. The circuit layer 120 may include a driving circuit of the pixel described.

The light emitting element layer 130 may be located on the circuit layer 120. The light emitting element layer 130 may include a light emitting element of the pixel. For example, the light emitting element may include an organic light emitting material, an inorganic light emitting material, an organic-inorganic light emitting material, a quantum dot, a quantum rod, a micro-LED, or a nano-LED.

The encapsulation layer 140 may be located on the light emitting element layer 130. The encapsulation layer 140 may protect the light emitting element layer 130 from moisture, oxygen, and a foreign substance such as dust particles. The encapsulation layer 140 may include at least one inorganic layer. The encapsulation layer 140 may include a stack structure in which an inorganic layer, an organic layer, and an inorganic layer are sequentially stacked.

The input sensor 200 may be located on the display panel 100. The input sensor 200 may sense an external input applied thereto from the outside. For example, the external input may be a user input. The user input may include a variety of external inputs, such as a part of user's body, light, heat, pen, or pressure.

The input sensor 200 may be formed on the display panel 100 through successive processes. In this case, the input sensor 200 may be located directly on the display panel 100. In the present disclosure, the expression "a component A is located directly on a component B" means that no intervening elements are present between the component A and the component B. That is, an adhesive layer may not be located between the input sensor 200 and the display panel 100.

The anti-reflective layer 300 may be located on the input sensor 200. The anti-reflective layer 300 may reduce a reflectance with respect to the external light. The anti-reflective layer 300 may be formed on the input sensor 200 through successive processes.

The anti-reflective layer 300 may include a light blocking pattern overlapping a reflective structure located under the anti-reflective layer 300. The anti-reflective layer 300 may further include a color filter layer overlapping a light emitting area described later. The color filter layer may include a first color filter, a second color filter, and a third color filter respectively corresponding to a first color pixel, a second color pixel, and a third color pixel.

The window 400 may be located on the anti-reflective layer 300. The window 400 may be coupled to the anti-reflective layer 300 by an adhesive layer AD. The adhesive layer AD may be a pressure sensitive adhesive (PSA) film or an optically clear adhesive (OCA).

The window 400 may include at least one base layer. The base layer may be a glass substrate or a synthetic resin film. The window 400 may have a multi-layer structure. The window 400 may include a thin film glass substrate and a synthetic resin film located on the thin film glass substrate. The thin film glass substrate may be coupled to the synthetic resin film by an adhesive layer, and the adhesive layer and the synthetic resin film may be separated from the thin glass substrate to be replaced.

According to some embodiments, the adhesive layer AD may be omitted, and the window 400 may be located directly on the anti-reflective layer 300. An organic material, an inorganic material, or a ceramic material may be coated on the anti-reflective layer 300.

Figure 3:
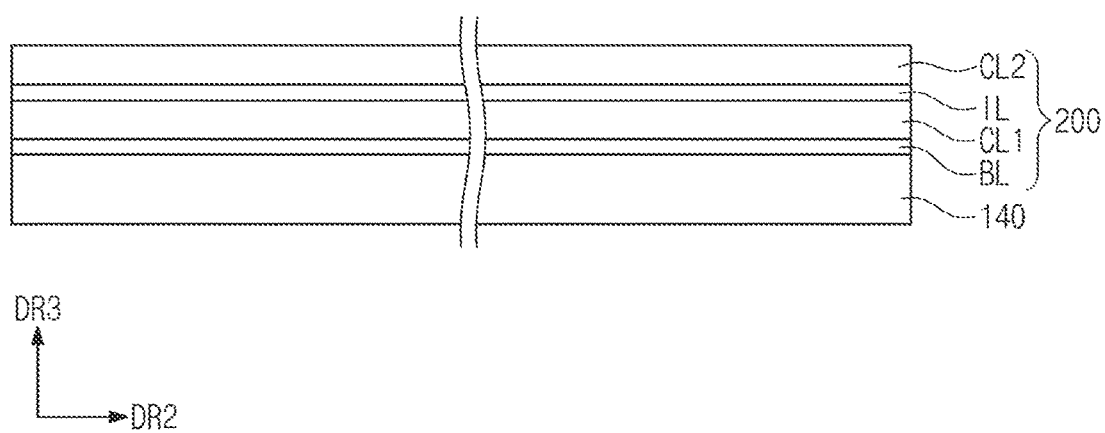
FIG. 3 is a cross-sectional view of a portion of a display device according to some embodiments of the present disclosure.

FIG. 3 is a cross-sectional view of the input sensor 200 according to some embodiments of the present disclosure.

The input sensor 200 may include a lower insulating layer BL, first conductive patterns CL1, an upper insulating layer IL, and second conductive patterns CL2. The lower insulating layer BL may be located directly on the encapsulation layer 140 of the display panel 100 (refer to FIG. 2).

According to some embodiments, the lower insulating layer BL may be omitted. When the lower insulating layer BL is omitted, the first conductive patterns CL1 may be located on an insulating layer provided as an uppermost layer of the encapsulation layer 140.

Each of the first conductive patterns CL1 and the second conductive patterns CL2 may have a single-layer structure or a multi-layer structure of layers stacked in the third direction DR3. The conductive pattern having the multi-layer structure may include at least two layers among transparent conductive layers and metal layers. The conductive pattern having the multi-layer structure may include metal layers including different metal materials. The transparent conductive layer may include indium tin oxide (ITO), indium zinc oxide (IZO), zinc oxide (ZnO), indium tin zinc oxide (ITZO), PEDOT, metal nanowire, graphene, or the like. The metal layer may include molybdenum, silver, titanium, copper, aluminum, or alloys thereof. The stack structure of each of the first conductive patterns CL1 and the second conductive patterns CL2 will be described in detail later.

According to some embodiments, the upper insulating layer IL may include a first insulating layer IL1 (refer to FIG. 6) and a second insulating layer IL2 (refer to FIG. 6) described later, one of the first insulating layer IL1 and the second insulating layer IL2 may be an inorganic layer, and the other of the first insulating layer IL1 and the second insulating layer IL2 may be an organic layer.

The inorganic layer may include silicon oxide, silicon nitride, or silicon oxynitride. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyimide-based resin, or a perylene-based resin.

Figure 4A:
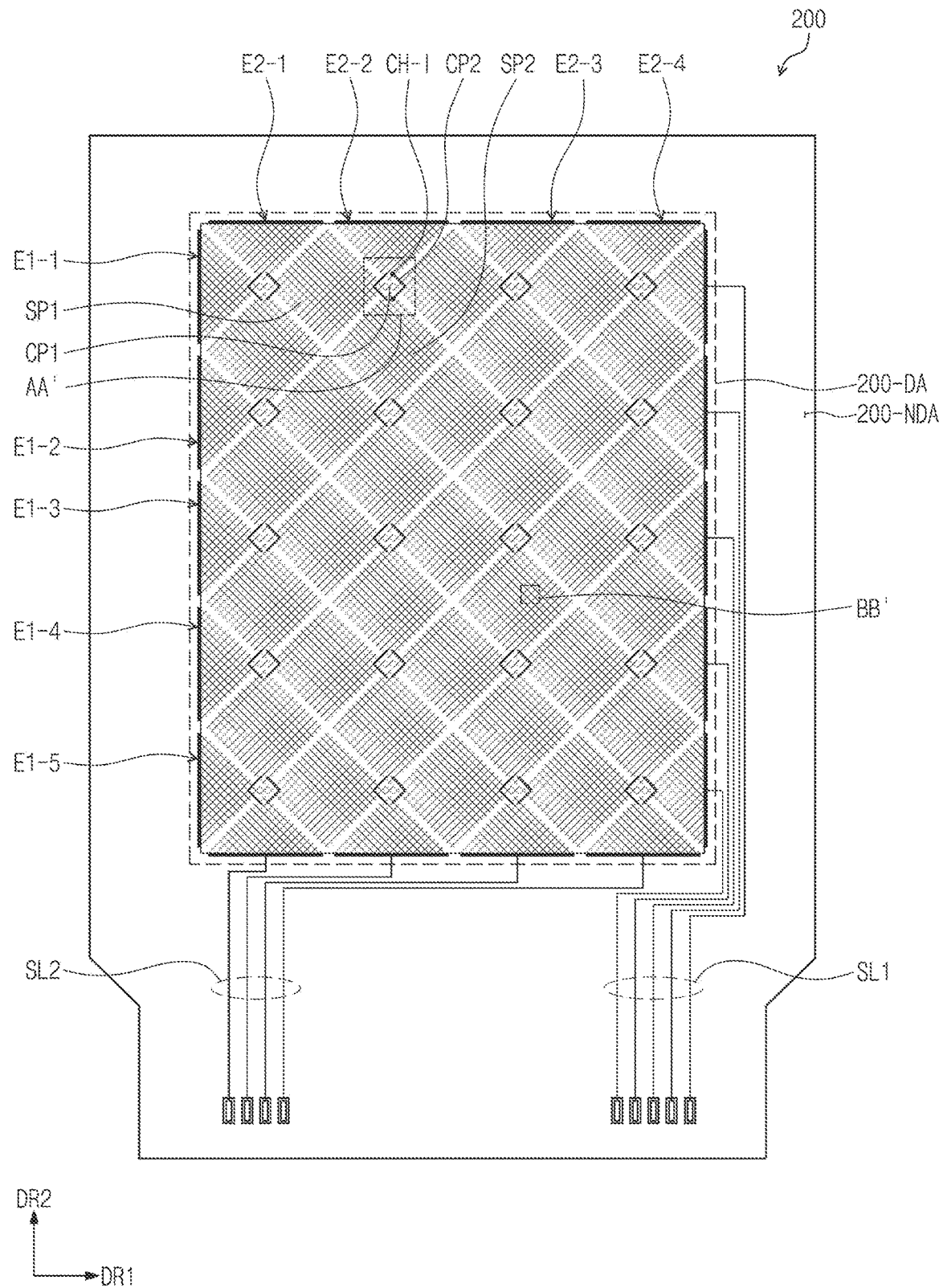
FIG. 4A is a plan view of an input sensor according to some embodiments of the present disclosure.
Figure 4B:
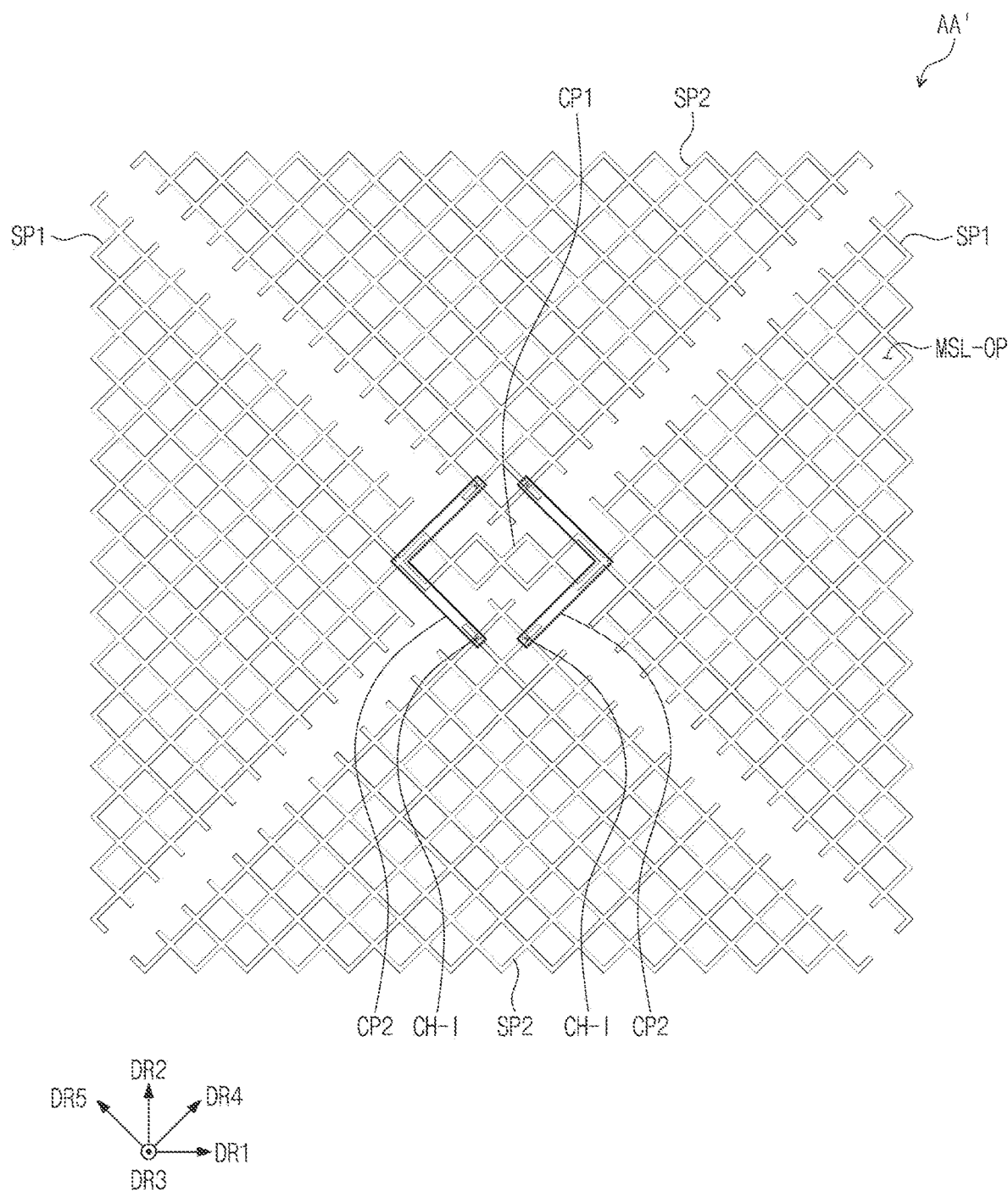
FIG. 4B is an enlarged plan view of an area AA' of FIG. 4A.
Figure 5:
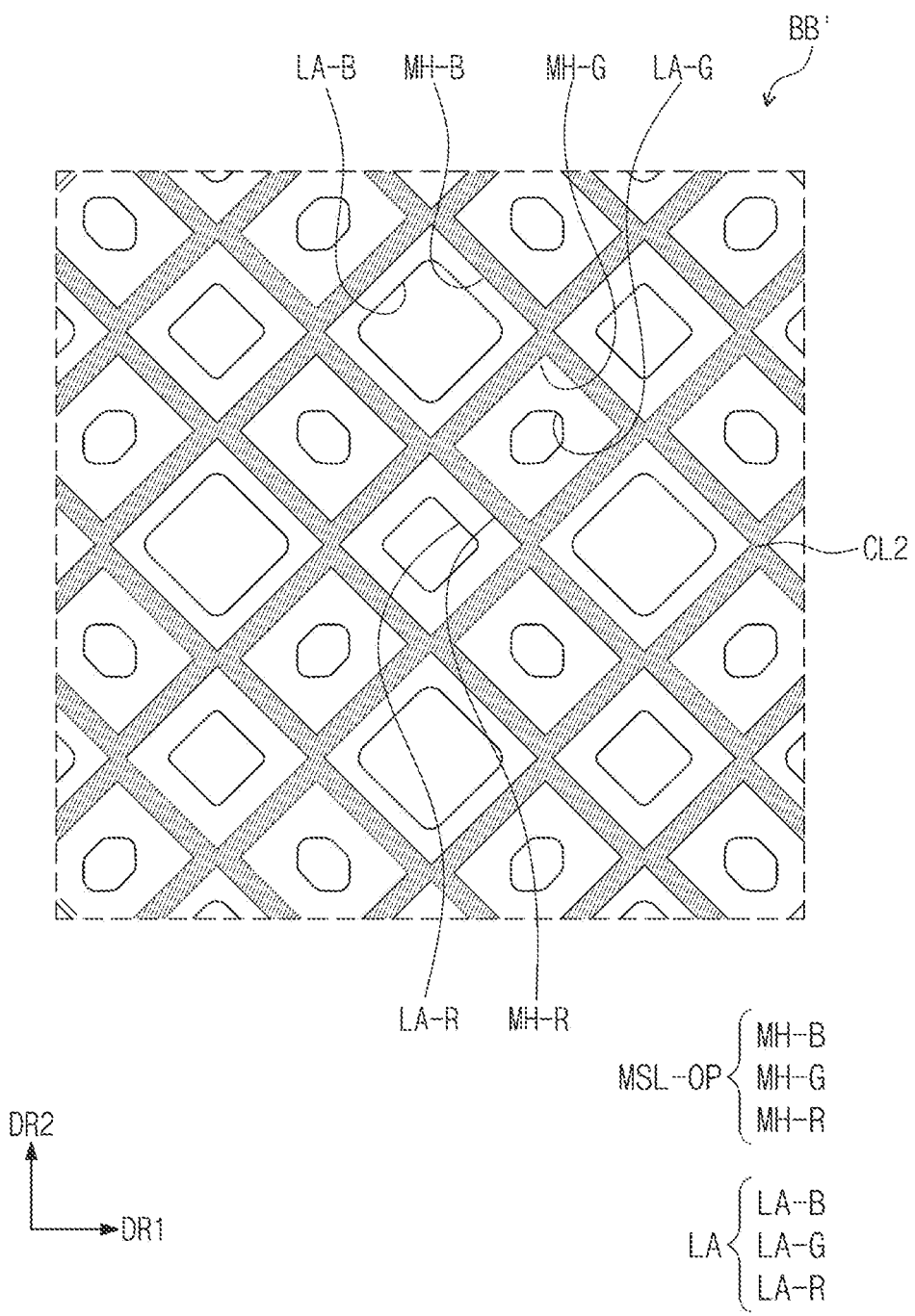
FIG. 5 is an enlarged plan view of an area BB' of FIG. 4A.

FIG. 4A is a plan view of the input sensor 200 according to some embodiments of the present disclosure. FIG. 4B is an enlarged plan view of an area AA' of FIG. 4A. FIG. 5 is an enlarged plan view of an area BB' of FIG. 4A.

Referring to FIGS. 4A and 4B, the input sensor 200 may include first electrodes E1-1 to E1-5 and second electrodes E2-1 to E2-4, which are located in a sensing area 200-DA and are insulated from each other while crossing each other. The input sensor 200 may include first signal lines SL1 located in a non-sensing area 200-NDA and electrically connected to the first electrodes E1-1 to E1-5 and second signal lines SL2 located in the non-sensing area 200-NDA and electrically connected to the second electrodes E2-1 to E2-4. The first electrodes E1-1 to E1-5, the second electrodes E2-1 to E2-4, the first signal lines SL1, and the second signal lines SL2 may be defined by a combination of the first conductive patterns CL1 and the second conductive patterns CL2 described with reference to FIG. 3.

Each of the first electrodes E1-1 to E1-5 and the second electrodes E2-1 to E2-4 may include a plurality of conductive lines crossing each other. The conductive lines may define a plurality of openings, and each of the first electrodes E1-1 to E1-5 and the second electrodes E2-1 to E2-4 may have a mesh shape. Each of the openings may be defined to correspond to a light emitting area LA (refer to FIG. 5) of the display panel 100 (refer to FIG. 2).

One of the first electrodes E1-1 to E1-5 and the second electrodes E2-1 to E2-4 may have an integrally formed shape. According to some embodiments, the first electrodes E1-1 to E1-5 may have an integrally formed shape. The first electrodes E1-1 to E1-5 may include first sensing portions SP1 and first connection portions CP1. A portion of the second conductive patterns CL2 may correspond to the first electrodes E1-1 to E1-5.

Each of the second electrodes E2-1 to E2-4 may include second sensing portions SP2 and second connection portions CP2. Two second sensing portions SP2 adjacent to each other may be connected to two second connection portions CP2 via a contact hole CH-I defined through the upper insulating layer IL (refer to FIG. 3), however, the number of the second connection portions CP2 should not be particularly limited. A portion of the second conductive patterns CL2 (refer to FIG. 3) may correspond to the second sensing portions SP2. A portion of the first conductive patterns CL1 (refer to FIG. 3) may correspond to the second connection portions CP2.

In this case, FIG. 4B may correspond to a portion of each of the first sensing portions SP1, the first connection portions CP1, the second sensing portions SP2, and the second connection portions BP2, which form one pattern, among the first electrodes E1-1 to E1-5 (refer to FIG. 4A) and the second electrodes E2-1 to E2-4 (refer to FIG. 4A).

According to some embodiments, the second connection portions CP2 may be formed from the first conductive patterns CL1 (refer to FIG. 3), and the first electrodes E1-1 to E1-5 and the second sensing portions SP2 may be formed from the second conductive patterns CL2 (refer to FIG. 3), however, they should not be limited thereto or thereby. According to some embodiments, the first electrodes E1-1 to E1-5 and the second sensing portions SP2 may be formed from the first conductive patterns CL1 (refer to FIG. 3), and the second connection portions CP2 may be formed from the second conductive patterns CL2 (refer to FIG. 3).

One of the first signal lines SL1 and the second signal lines SL2 may receive a transmission signal from an external circuit to sense an external input, and the other of the first signal lines SL1 and the second signal lines SL2 may transmit a variation in capacitance between the first electrodes E1-1 to E1-5 and the second electrodes E2-1 to E2-4 to the external circuit as a reception signal.

A portion of the second conductive patterns CL2 (refer to FIG. 3) may correspond to the first signal lines SL1 and the second signal lines SL2. The first signal lines SL1 and the second signal lines SL2 may have a multi-layer structure and may include a first layer line formed from the first conductive patterns CL1 (refer to FIG. 3) and a second layer line formed from the second conductive patterns CL2 (refer to FIG. 3). The first layer line and the second layer line may be connected to each other via a contact hole defined through the upper insulating layer IL (refer to FIG. 3).

FIG. 5 is an enlarged view showing a portion of the second conductive patterns CL2 of the mesh shape, and for the convenience of explanation, the lower and upper insulating layers BL and IL of the input sensor 200 described with reference to FIG. 3 are omitted.

As shown in FIG. 5, mesh openings MSL-OP defined through the second conductive patterns CL2 may correspond to the light emitting areas LA, respectively. That is, the mesh openings MSL-OP may correspond to the light emitting areas LA in a one-to-one correspondence. The mesh opening MSL-OP may have a size greater than a size of a corresponding light emitting area among the light emitting areas LA, and the mesh shape may not overlap the light emitting areas LA.

Three types of mesh openings MH-R, MH-G, and MH-B may be defined through the second conductive patterns CL2. The three types of mesh openings MH-R, MH-G, and MH-B may correspond to three types of light emitting areas LA-R, LA-G, and LA-B. The three types of light emitting areas LA-R, LA-G, and LA-B may be distinguished from each other depending on their sizes and may provide lights having different colors from each other.

Figure 6:
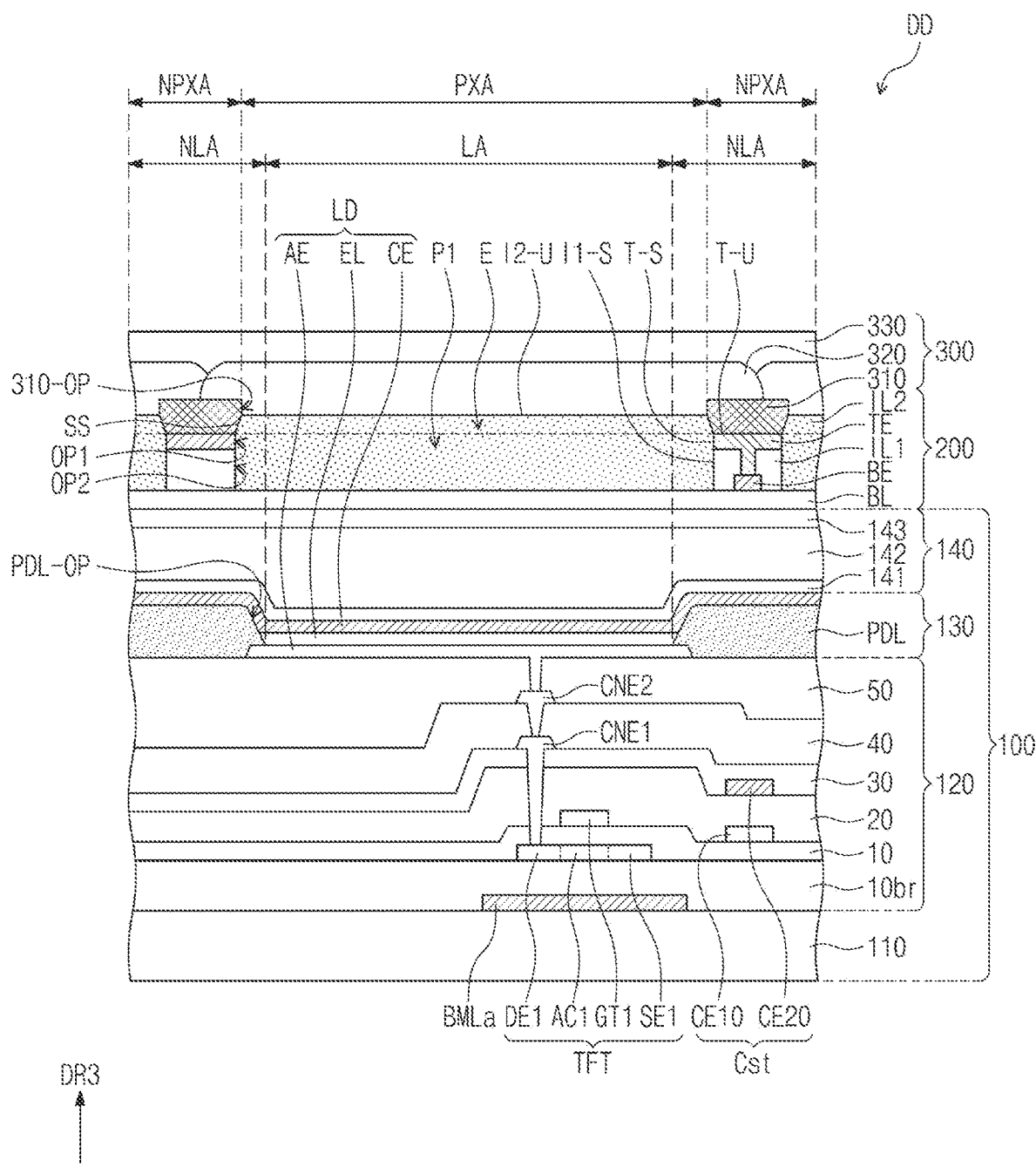
FIG. 6 is a cross-sectional view of a display device according to some embodiments of the present disclosure.

FIG. 6 is a cross-sectional view of the display device DD according to some embodiments of the present disclosure. FIG. 6 shows a cross-section corresponding to one light emitting area LA and a non-light-emitting area NLA. The light emitting area LA shown in FIG. 6 may correspond to one of the three types of the light emitting areas LA-R, LA-G, and LA-B described with reference to FIG. 5.

FIG. 6 shows a light emitting element LD and a transistor TFT connected to the light emitting element LD, which are included in the display device DD. The transistor TFT may be one of a plurality of transistors included in a pixel driving circuit. According to some embodiments, the transistor TFT will be described as a silicon transistor, however, according to some embodiments, the transistor TFT may be a metal oxide transistor.

The display device DD may include the display panel 100, the input sensor 200, and the anti-reflective layer 300. The window 400 described with reference to FIG. 2 is omitted.

The display panel 100 may include the base layer 110, the circuit layer 120, the light emitting element layer 130, and the encapsulation layer 140.

A buffer layer 10br may be located on the base layer 110. The buffer layer 10br may prevent or reduce instances or quantities of metal atoms or impurities being diffused upward to a semiconductor pattern from the base layer 110. The semiconductor pattern may include an active area AC1 of the transistor TFT.

A rear surface metal layer BMLa may be located under the transistor TFT. The rear surface metal layer BMLa may prevent or reduce external light reaching the transistor TFT. The rear surface metal layer BMLa may be located between the base layer 110 and the buffer layer 10br. According to some embodiments, an inorganic barrier layer may be further located between the rear surface metal layer BMLa and the buffer layer 10br. The rear surface metal layer BMLa may be connected to an electrode or a wire and may receive a constant voltage or a signal from the electrode or wire.

The semiconductor pattern may be located on the buffer layer 10br. The semiconductor pattern may include a silicon semiconductor. As an example, the silicon semiconductor may include amorphous silicon or polycrystalline silicon. For example, the semiconductor pattern may include low temperature polycrystalline silicon.

The semiconductor pattern may include a first region having a relatively high conductivity and a second region having a relatively low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially serve as an electrode or a signal line. The second region may correspond (or substantially correspond) to an active area (or a channel) of the transistor. In other words, a portion of the semiconductor pattern may be the active area of the transistor, another portion of the semiconductor pattern may be a source area or a drain area of the transistor, and the other portion of the semiconductor pattern may be a connection electrode or a connection signal line.

A source area SE1 (or a source), the active area AC1 (or a channel), and a drain area DE1 (or a drain) of the transistor TFT may be formed from the semiconductor pattern. The source area SE1 and the drain area DE1 may extend in opposite directions to each other from the active area AC1 in a cross-section.

A first insulating layer 10 may be located on the buffer layer 10br. The first insulating layer 10 may commonly overlap the pixels and may cover the semiconductor pattern. The first insulating layer 10 may include an inorganic layer and/or an organic layer and may have a single-layer or multi-layer structure. The inorganic layer may include at least one of aluminum oxide, titanium oxide, silicon oxide, silicon nitride, silicon oxynitride, zirconium oxide, or hafnium oxide. According to some embodiments, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include at least one of the above-mentioned materials, however, it should not be limited thereto or thereby.

A gate GT1 of the transistor TFT may be located on the first insulating layer 10. The gate GT1 may be a portion of a metal pattern. The gate GT1 may overlap the active area AC1. The gate GT1 may be used as a mask in a process of doping the semiconductor pattern. The gate GT1 may include titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), or the like, however, it should not be particularly limited.

A second insulating layer 20 may be located on the first insulating layer 10 and may cover the gate GT1. A third insulating layer 30 may be located on the second insulating layer 20. A second electrode CE20 of a storage capacitor Cst may be located between the second insulating layer 20 and the third insulating layer 30. In addition, a first electrode CE10 of the storage capacitor Cst may be located between the first insulating layer 10 and the second insulating layer 20.

A first connection electrode CNE1 may be located on the third insulating layer 30. The first connection electrode CNE1 may be connected to the drain area DE1 of the transistor TFT via a contact hole defined through the first, second, and third insulating layers 10, 20, and 30.

A fourth insulating layer 40 may be located on the third insulating layer 30. A second connection electrode CNE2 may be located on the fourth insulating layer 40. The second connection electrode CNE2 may be connected to the first connection electrode CNE1 via a contact hole defined through the fourth insulating layer 40. A fifth insulating layer 50 may be located on the fourth insulating layer 40 and may cover the second connection electrode CNE2. The stack structure of the first insulating layer 10 to the fifth insulating layer 50 is merely one example, and additional conductive layer and insulating layer may be further located in addition to the first insulating layer 10 to fifth insulating layer 50.

Each of the fourth insulating layer 40 and the fifth insulating layer 50 may include an organic layer. As an example, the organic layer may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The light emitting element LD may include a first electrode AE (or a pixel electrode), a light emitting layer EL, and a second electrode CE (or a common electrode). The first electrode AE may be located on the fifth insulating layer 50. The first electrode AE may be a semi-transmissive electrode, a transmissive electrode, or a reflective electrode. According to some embodiments, the first electrode AE may include a reflective layer formed of Ag, Mg, Al, Pt, Pd, Au, Ni, Nd, Ir, Cr, or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide (In2O3), and aluminum-doped zinc oxide (AZO). For instance, the first electrode AE may have a stack structure of ITO/Ag/ITO.

A pixel definition layer PDL may be located on the fifth insulating layer 50. According to some embodiments, the pixel definition layer PDL may have a light absorbing property. For example, the pixel definition layer PDL may have a black color. The pixel definition layer PDL may include a black coloring agent. The black coloring agent may include a black dye or a black pigment. The black coloring agent may include a metal material, such as carbon black, chromium, or an oxide thereof.

The pixel definition layer PDL may cover a portion of the first electrode AE. As an example, the pixel definition layer PDL may be provided with a pixel opening PDL-OP defined therethrough to expose the portion of the first electrode AE. The light emitting area LA may be defined by the pixel opening PDL-OP of the pixel definition layer PDL. The light emitting area LA shown in FIG. 6 may correspond to one of the light emitting areas LA-G, LA-R, and LA-B shown in FIG. 5.

The pixel definition layer PDL may increase a distance between an edge of the first electrode AE and the second electrode CE. Accordingly, an occurrence of arc on the edge of the first electrode AE may be prevented or reduced by the pixel definition layer PDL.

According to some embodiments, a hole control layer may be located between the first electrode AE and the light emitting layer EL. The hole control layer may include a hole transport layer and may further include a hole injection layer. An electron control layer may be located between the light emitting layer EL and the second electrode CE. The electron control layer may include an electron transport layer and may further include an electron injection layer.

The encapsulation layer 140 may be located on the light emitting element layer 130. The encapsulation layer 140 may include an inorganic layer 141, an organic layer 142, and an inorganic layer 143, which are sequentially stacked, however, layers included in the encapsulation layer 140 should not be limited thereto or thereby.

The inorganic layers 141 and 143 may protect the light emitting element layer 130 from moisture and oxygen, and the organic layer 142 may protect the light emitting element layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer 142 may include an acrylic-based organic layer, however, it should not be limited thereto or thereby.

The input sensor 200 may be located on the display panel 100. The input sensor 200 may include the lower insulating layer BL, a bridge electrode BE, the first insulating layer IL1, a sensing electrode TE, and the second insulating layer IL2.

The bridge electrode BE shown in FIG. 6 may be included in the first conductive patterns CL1 described with reference to FIG. 3. The sensing electrode TE shown in FIG. 6 may be included in the second conductive patterns CL2 described with reference to FIG. 3. The first insulating layer IL1 and the second insulating layer IL2 shown in FIG. 6 may be included in the upper insulating layer IL described with reference to FIG. 3.

The lower insulating layer BL may be located on the encapsulation layer 140 of the display panel 100. The lower insulating layer BL may be arranged to overlap the light emitting area LA and the non-light-emitting area NLA. According to some embodiments, the lower insulating layer BL may be an inorganic layer.

The bridge electrode BE may be located on the lower insulating layer BL.

The first insulating layer IL1 may be located on the lower insulating layer BL, and the sensing electrode TE may be located on the first insulating layer IL1. According to some embodiments, the sensing electrode TE may define a first opening OP1, and the first insulating layer IL1 may define a second opening OP2. In this case, the first opening OP1 of the sensing electrode TE may correspond to the mesh opening MSL-OP described with reference to FIG. 5.

According to some embodiments, the second opening OP2 may be formed through an etching process performed using the sensing electrode TE as a mask, and thus, the first opening OP1 and the second opening OP2 may have substantially the same shape when viewed in a plane. That is, the first opening OP1 and the second opening OP2 may have substantially the same size.

According to some embodiments, an angle between a side surface I1-S of the first insulating layer IL1 and the lower insulating layer BL may be about 90 degrees. In this case, the second opening OP2 defined by the side surface I1-S of the first insulating layer IL1 may have the same shape as the first opening OP1 in a plane from a portion in contact with the sensing electrode TE to a portion in contact with the lower insulating layer BL. That is, the entire second opening OP2 extending in the third direction DR3 may have the same shape as that of the first opening OP1 when viewed in a plane.

According to some embodiments, the side surface I1-S of the first insulating layer IL1 may have a taper angle (e.g., a set or predetermined taper angle), and in this case, the angle between the side surface I1-S of the first insulating layer IL1 and the lower insulating layer BL may be equal to or greater than about 79 degrees and smaller than about 90 degrees.

In the present disclosure, the expression "the second opening OP2 has substantially the same shape as the first opening OP1" may include a case where the shape of the second opening OP2 has a slightly different portion from the shape of the first opening OP1 due to the taper angle (e.g., a set or predetermined taper angle) of the side surface I1-S of the first insulating layer IL1.

In detail, when the angle between the side surface I1-S of the first insulating layer IL1 and the lower insulating layer BL is equal to or greater than about 79 degrees and smaller than about 90 degrees, the second opening OP2 may have the same shape as that of the first opening OP1 in the portion in contact with the sensing electrode TE and may be slightly smaller than the first opening OP1 as a distance from the lower insulating layer BL decreases. In this case, the second opening OP2 may be considered to have substantially the same shape as the first opening OP1.

In addition, in the present disclosure, the expression "the second opening OP2 has substantially the same shape as the first opening OP1" may include a case where the shape of the second opening OP2 has a slightly different portion from the shape of the first opening OP1 in an etching area defined as the sensing electrode TE due to an error in etching degree occurring in the etching process. Further, the expression "the second opening OP2 has substantially the same shape as the first opening OP1" may include a case where the shape of the second opening OP2 has a slightly different portion from the shape of the first opening OP1 due to impurities generated in the etching process and accumulated around the second opening OP2 of the first insulating layer IL1.

According to some embodiments, a side surface T-S of the sensing electrode TE may be aligned with the side surface I1-S of the first insulating layer IL1.

The second insulating layer IL2 may be located on the lower insulating layer BL. According to some embodiments, the second insulating layer IL2 may include a first portion P1 and a protruding portion E extending in the third direction DR3 from the first portion P1.

The first portion P1 may be located inside the first opening OP1 of the sensing electrode TE and inside the second opening OP2 of the first insulating layer IL1. That is, the first portion P1 may cover the side surface T-S of the sensing electrode TE and the side surface I1-S of the first insulating layer IL1.

The protruding portion E may protrude from an upper surface T-U of the sensing electrode TE and may have a step difference with respect to the upper surface T-U of the sensing electrode TE. According to some embodiments, the step difference may be generated in the etching process of the second insulating layer IL2. The etching process of the second insulating layer IL2 will be described in detail later.

The step difference may include a slant surface SS of the second insulating layer IL2 inclined in a direction away from the upper surface T-U of the sensing electrode TE from the upper surface T-U of the sensing electrode TE. The protruding portion E of the second insulating layer IL2 may have a width that decreases as a distance from the first portion P1 increases.

In FIG. 6, the slant surface SS is shown as a straight line in a cross-section, however, it should not be limited thereto or thereby. According to some embodiments, the slant surface SS may have a curvature (e.g., a set or predetermined curvature) in the cross-section. In addition, the slant surface SS may extend vertically from the upper surface T-U of the sensing electrode TE.

The second insulating layer IL2 may fill an inner space of each of the mesh openings MSL-OP described with reference to FIGS. 4B and 5. Accordingly, the second insulating layer IL2 may be formed into a pattern having the same shape and the same arrangement as those of the three types of the mesh openings MH-B, MH-G, and MH-R (refer to FIG. 5) when viewed in a plane.

According to some embodiments, when one of the first insulating layer IL1 and the second insulating layer IL2 includes an organic material, the other of the first insulating layer IL1 and the second insulating layer IL2 may include an inorganic material.

Hereinafter, in the present disclosure, the term "first case" may refer to embodiments in which the first insulating layer IL1 is the inorganic layer and the second insulating layer IL2 is the organic layer, and the term "second case" may refer to embodiments in which the first insulating layer IL1 is the organic layer and the second insulating layer IL2 is the inorganic layer.

As the upper insulating layer IL (refer to FIG. 3) of the input sensor 200 includes the organic layer and the inorganic layer, folding characteristics of the upper insulating layer IL may be improved by using the organic layer, a rigidity of the upper insulating layer IL may increase by using the inorganic layer, and thus, an impact resistance of the upper insulating layer IL may be improved. The occurrence of cracks in the insulating layer may be reduced compared with a case where the upper insulating layer IL includes only the organic layer and a case where the upper insulating layer IL includes only the inorganic layer.

When the input sensor 200 corresponds to the first case, the first insulating layer IL1 including the inorganic layer may have the same mesh shape as the sensing electrode TE when viewed in a plane, and the second insulating layer IL2 including the organic layer may be formed in a pattern shape to fill the mesh opening MSL-OP.

In this case, as the second insulating layer IL2 has the pattern shape, the occurrence of the cracks may be prevented or reduced due to impact absorption characteristics of the organic layer even though an external impact is applied to the area overlapping the mesh opening MSL-OP.

When the input sensor 200 corresponds to the second case, the first insulating layer IL1 including the organic layer may have the same mesh shape as the sensing electrode TE when viewed in a plane, and the second insulating layer IL2 including the inorganic layer may be formed in the pattern shape to fill the mesh opening MSL-OP.

In this case, as the second insulating layer IL2 has the pattern shape, the cracks may not propagate to other patterns spaced apart by the first insulating layer IL1 even though the cracks occur in a portion of the second insulating layer IL2 due to the external impact.

The anti-reflective layer 300 may be located on the input sensor 200. The anti-reflective layer 300 may include a light blocking pattern 310, a color filter layer 320, and a planarization layer 330.

The light blocking pattern 310 may be located on the sensing electrode TE. The light blocking pattern 310 may cover the upper surface T-U of the sensing electrode TE and the slant surface SS of the second insulating layer IL2 protruded from the upper surface T-U of the sensing electrode TE. That is, the light blocking pattern 310 may be located in an inner space defined by the protruding portion E of the second insulating layer IL2 and may protrude from an upper surface I2-U of the second insulating layer IL2.

Materials for the light blocking pattern 310 may include any suitable light blocking material configured to absorb light and/or prevent light from passing through the light blocking pattern 310. The light blocking pattern 310 may include a black coloring agent. The black coloring agent may include a black dye or a black pigment. The black coloring agent may include a metal material, such as carbon black, chromium, or an oxide thereof. Therefore, the light blocking pattern 310 may have a black color.

The light blocking pattern 310 may overlap the bridge electrode BE and the sensing electrode TE. Accordingly, the light blocking pattern 310 may have a shape corresponding to the mesh shape of the second conductive patterns CL2 described with reference to FIG. 5 when viewed in a plane. The light blocking pattern 310 may prevent or reduce the external light being reflected by the first conductive patterns CL1 (refer to FIG. 3) and the second conductive patterns CL2 (refer to FIG. 3).

The light blocking pattern 310 may be provided with a light blocking opening 310-OP defined therethrough. The light blocking opening 310-OP of the light blocking pattern 310 may overlap the first electrode AE and may have a size greater than that of the pixel opening PDL-OP of the pixel definition layer PDL. The light blocking opening 310-OP of the light blocking pattern 310 may define a pixel area PXA. The pixel area PXA may be defined as an area from which the light generated by the light emitting element LD exits to the outside. As the size of the pixel area PXA increases, a luminance of the image may increase.

FIG. 6 shows a structure in which the light emitting area LA entirely overlaps the pixel area PXA as a representative example. That is, FIG. 6 shows the structure in which the size of the pixel opening PDL-OP is smaller than the size of the light blocking opening 310-OP as an example, however, a size ratio of the light emitting area LA to the pixel area PXA should not be particularly limited. As an example, the size of the pixel opening PDL-OP may be the same as the size of the light blocking opening 310-OP, or the size of the pixel opening PDL-OP may be greater than the size of the light blocking opening 310-OP.

FIG. 6 shows the shape of the light blocking pattern 310 as a representative example, however, the shape of the light blocking pattern 310 should not be particularly limited. As an example, a portion of the light blocking pattern 310, which is covered by the color filter layer 320, may have a rounded edge, or a portion of the light blocking pattern 310, which is located in the inner space defined by the protruding portion E of the second insulating layer IL2, may be changed depending on the shape of the slant surface SS of the second insulating layer IL2.

The color filter layer 320 may be located on the second insulating layer IL2 and may cover the light blocking pattern 310. The color filter layer 320 may overlap at least the pixel area PXA. The color filter layer 320 may further overlap a non-pixel area NPXA. A portion of the color filter layer 320 may be located on the light blocking pattern 310. The color filter layer 320 may transmit the light generated by the light emitting element LD and may block some wavelength bands of the external light. Accordingly, the color filter layer 320 may reduce a reflection of the external light, which is caused by the first electrode AE or the second electrode CE.

The planarization layer 330 may cover the light blocking pattern 310 and the color filter layer 320. The planarization layer 330 may include an organic material, and the planarization layer 330 may provide a flat upper surface.

According to some embodiments, the light blocking pattern 310 of the anti-reflective layer 300 may be omitted. When the light blocking pattern 310 is omitted, the color filter layer 320 may be located on the sensing electrode TE and the second insulating layer IL2, and the upper surface T-U of the sensing electrode TE and the slant surface SS of the second insulating layer IL2 may be in contact with the color filter layer 320.

Figure 7A:
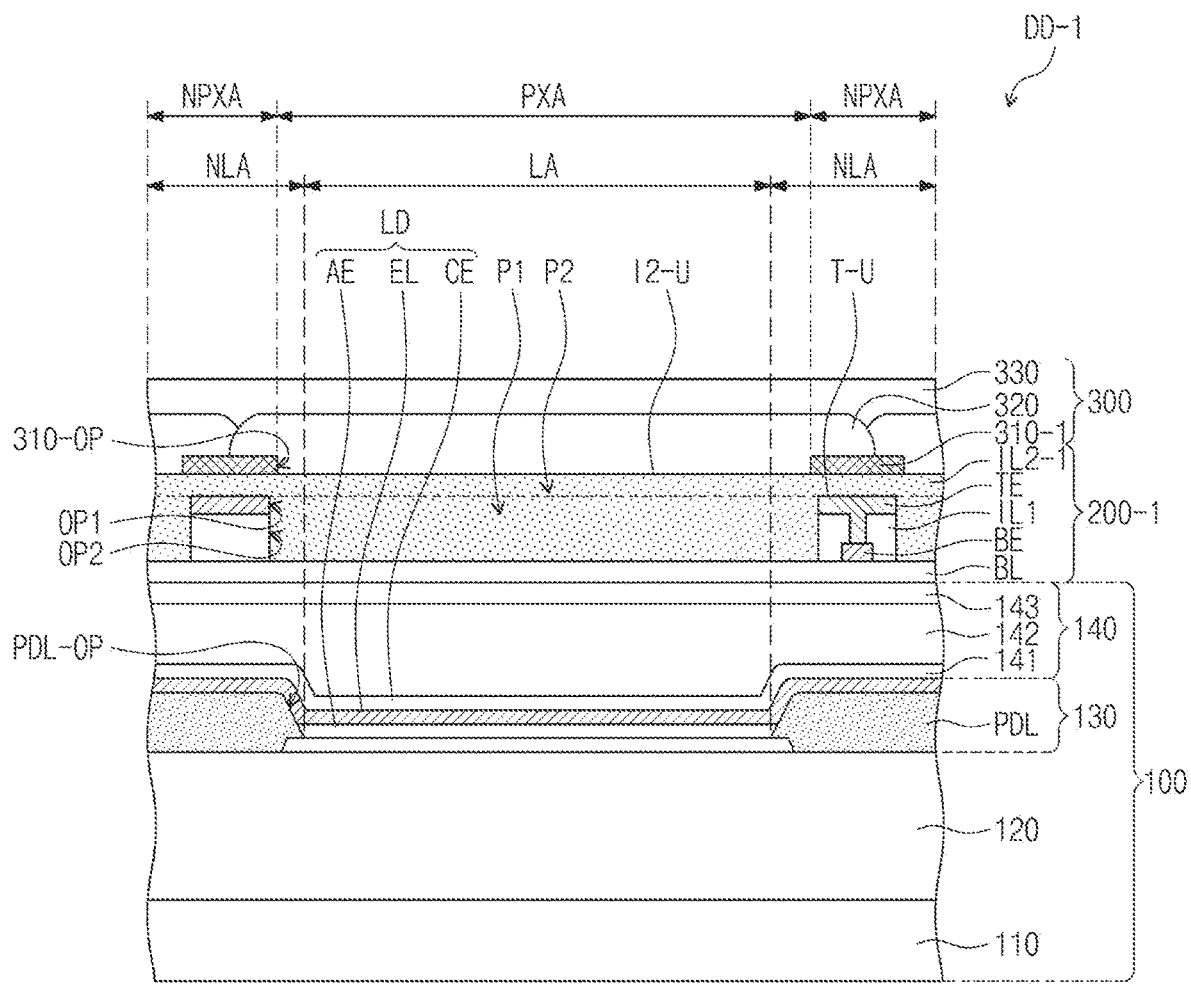
FIG. 7A is a cross-sectional view of a display device according to some embodiments of the present disclosure.
Figure 7B:
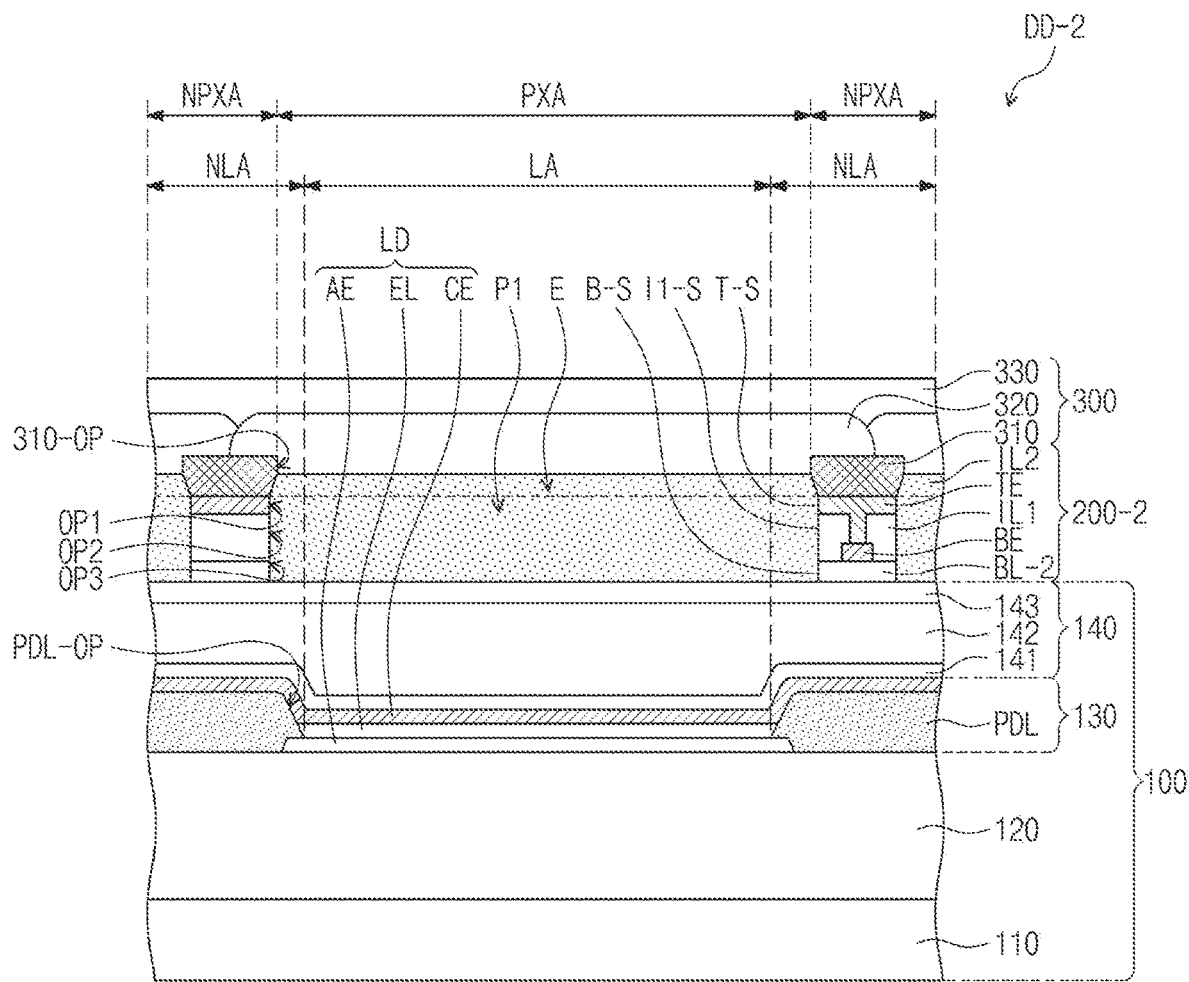
FIG. 7B is a cross-sectional view of a display device according to some embodiments of the present disclosure.

FIG. 7A is a cross-sectional view of a display device DD-1 according to some embodiments of the present disclosure, and FIG. 7B is a cross-sectional view of a display device DD-2 according to some embodiments of the present disclosure. The display device DD-1 shown in FIG. 7A has the same structure and function as those of the display device DD described with reference to FIG. 6 except a second insulating layer IL2-1, and the display device DD-2 shown in FIG. 7B has the same structure and function as those of the display device DD described with reference to FIG. 6 except a lower insulating layer BL-2.

In FIGS. 7A and 7B, components of a circuit layer 120 of a display panel 100 are omitted. The components of the circuit layer 120 and a stack structure of the components are the same as those of FIG. 6.

Referring to FIG. 7A, an input sensor 200-1 may include the second insulating layer IL2-1 including a first portion P1 and a second portion P2. The first portion P1 may be located inside a first opening OP1 of a sensing electrode TE and inside a second opening OP2 of a first insulating layer IL1. The second portion P2 may extend from the first portion P1 to the third direction DR3 and may overlap a light emitting area LA and a non-light-emitting area NLA.

A separate patterning process may not be performed on the second insulating layer IL2-1 of FIG. 7A different from the second insulating layer IL2 of FIG. 6. Accordingly, the second insulating layer IL2-1 may cover an upper surface T-U of the sensing electrode TE, and thus, the upper surface T-U of the sensing electrode TE may not be exposed.

According to some embodiments, a light blocking pattern 310-1 may be located on the second insulating layer IL2-1 and may overlap the sensing electrode TE. The light blocking pattern 310-1 may be in contact with an upper surface I2-U of the second insulating layer IL2-1 and may not be in contact with the upper surface T-U of the sensing electrode TE different from the light blocking pattern 310 of FIG. 6.

Referring to FIG. 7B, an input sensor 200-2 may include a lower insulating layer BL-2 through which a third opening OP3 is defined. The third opening OP3 may overlap a first opening OP1 and a second opening OP2 when viewed in a plane and may have the same shape (or substantially the same shape) the first opening OP1 and the second opening OP2. Accordingly, a side surface B-S of the lower insulating layer BL-2 may be aligned with a side surface T-S of a sensing electrode TE and a side surface I1-S of a first insulating layer IL1.

According to some embodiments, the third opening OP3 may be formed by an etching process performed using the sensing electrode TE as a mask like the second opening OP2. The etching process for the third opening OP3 will be described in detail later.

FIG. 7B shows a structure in which a second insulating layer IL2 includes a first portion P1 and a protruding portion E as a representative example, however, it should not be limited thereto or thereby. The lower insulating layer BL-2 according to some embodiments may be applied to the structure in which the second insulating layer IL2 includes the first portion P1 and the second portion P2.

FIGS. 8A to 8I are cross-sectional views of a method of manufacturing a display device according to some embodiments of the present disclosure. For the convenience of explanation, FIGS. 8A to 8I show the manufacturing method of the display device DD shown in FIG. 6 as a representative example. In FIGS. 8A to 8I, the same reference numerals denote the same elements in FIG. 6, and thus, detailed descriptions of the same elements will be omitted. Hereinafter, the manufacturing method of the display device DD will be described with reference to FIGS. 8A to 8I.

Figure 8A:
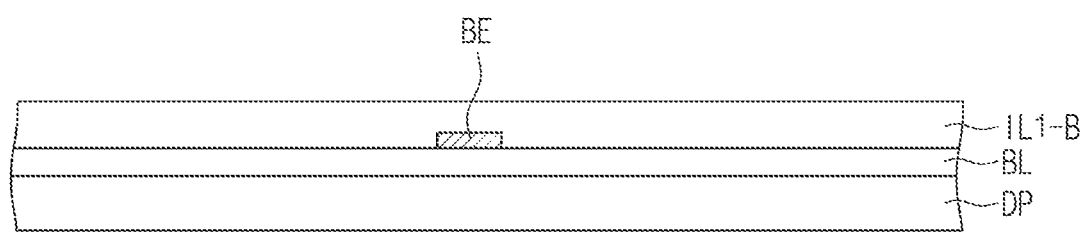
FIGS. 8A to 8I are cross-sectional views of a method of manufacturing a display device according to some embodiments of the present disclosure.

Referring to FIG. 8A, a lower insulating layer BL, a bridge electrode BE, and a first initial insulating layer IL1-B are formed on the display panel DP. The display panel DP may include the same components and the same stack structure as those of the display panel 100 described with reference to FIG. 6.

According to some embodiments, the lower insulating layer BL is formed on the display panel DP, a conductive material is coated on an upper surface of the lower insulating layer BL, and the coated conductive material layer is patterned to form the bridge electrode BE.

The first initial insulating layer IL1-B is formed on the lower insulating layer BL on which the bridge electrode BE is formed. The first initial insulating layer IL1-B is formed to cover the bridge electrode BE.

Figure 8B:
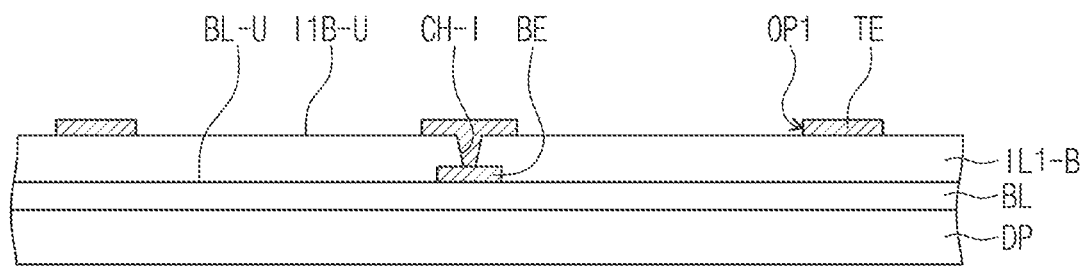

Then, as shown in FIG. 8B, a contact hole CH-I is formed through the first initial insulating layer IL1-B. The contact hole CH-I is formed by removing the first initial insulating layer IL1-B overlapping a portion of the bridge electrode BE.

A sensing electrode TE is formed on the first initial insulating layer IL1-B through which the contact hole CH-I is formed. According to some embodiments, the sensing electrode TE is formed by coating a conductive material on an upper surface I1B-U of the first initial insulating layer IL1-B and patterning the coated conductive material layer. A first opening OP1 is formed through the sensing electrode TE. The first opening OP1 corresponds to the mesh opening MSL-OP described with reference to FIG. 5.

The sensing electrode TE is in contact with the bridge electrode BE via the contact hole CH-I formed through the first initial insulating layer IL1-B in a portion overlapping the bridge electrode BE.

Figure 8C:
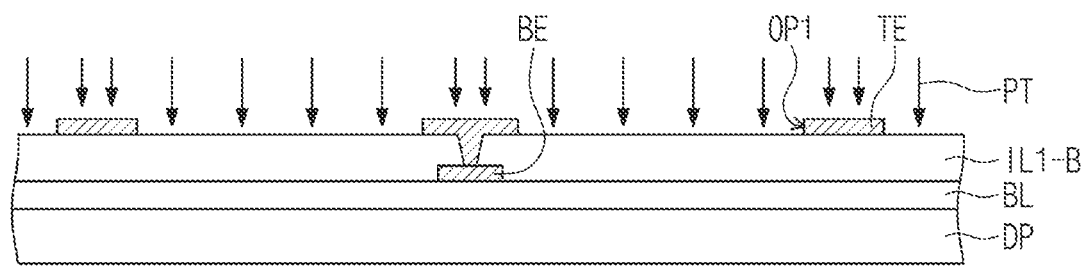

Then, as shown in FIG. 8C, a light PT is irradiated onto the first initial insulating layer IL1-B using the sensing electrode TE as a mask. According to some embodiments, the first initial insulating layer IL1-B includes a positive type material from which a portion exposed to the light PT is removed.

Figure 8D:
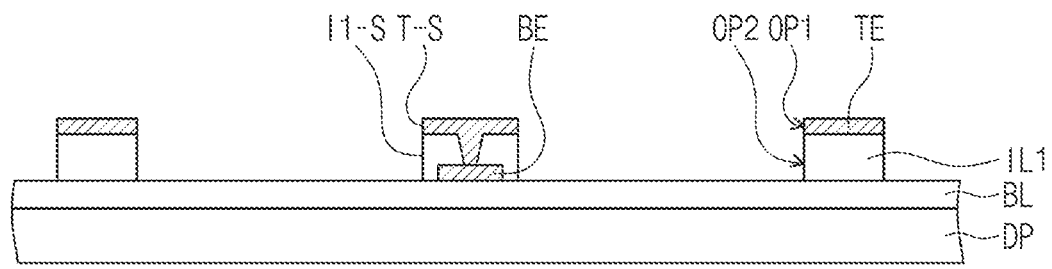

Referring to FIG. 8D, a first insulating layer IL1 is formed by removing portions exposed to the light through a development process. According to some embodiments, the first insulating layer IL1 is patterned through a dry etching process. In this case, the sensing electrode TE is provided as a hard mask, and the first insulating layer IL1 is etched in a direction perpendicular to the lower insulating layer BL. Accordingly, a side surface I1-S of the first insulating layer IL1 is formed perpendicular (or substantially perpendicular) to the lower insulating layer BL.

A second opening OP2 is formed through the first insulating layer IL1. As the portion of the first initial insulating layer IL1-B, which overlaps the first opening OP1, is removed after being exposed to the light, the second opening OP2 is formed to overlap the first opening OP1.

That is, the second opening OP2 has the same shape (or substantially the same shape) as that of the first opening OP1 when viewed in a plane. Accordingly, a side surface T-S of the sensing electrode TE is aligned with the side surface I1-S of the first insulating layer IL1.

In the present disclosure, the expression "the second opening OP2 has substantially the same shape as the first opening OP1" may include a case where the shape of the second opening OP2 has a slightly different portion from the shape of the first opening OP1 due to a tolerance in the etching process by an etching degree of the first insulating layer IL1. As an example, the side surface I1-S of the first insulating layer IL1, which defines the second opening OP2, may be irregularly formed depending on etching conditions, and the shape of the second opening OP2 defined by irregular side surfaces may be the same as the first opening OP1.

Figure 8E:
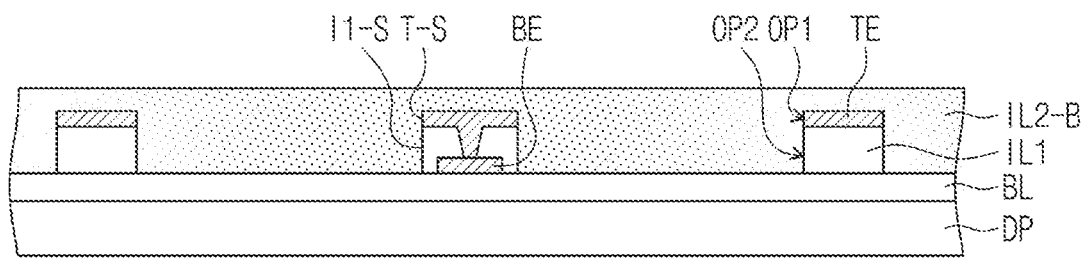

Referring to FIG. 8E, a second initial insulating layer IL2-B is formed on the lower insulating layer BL. The second initial insulating layer IL2-B is formed to cover the sensing electrode TE and the first insulating layer IL1.

Figure 8F:
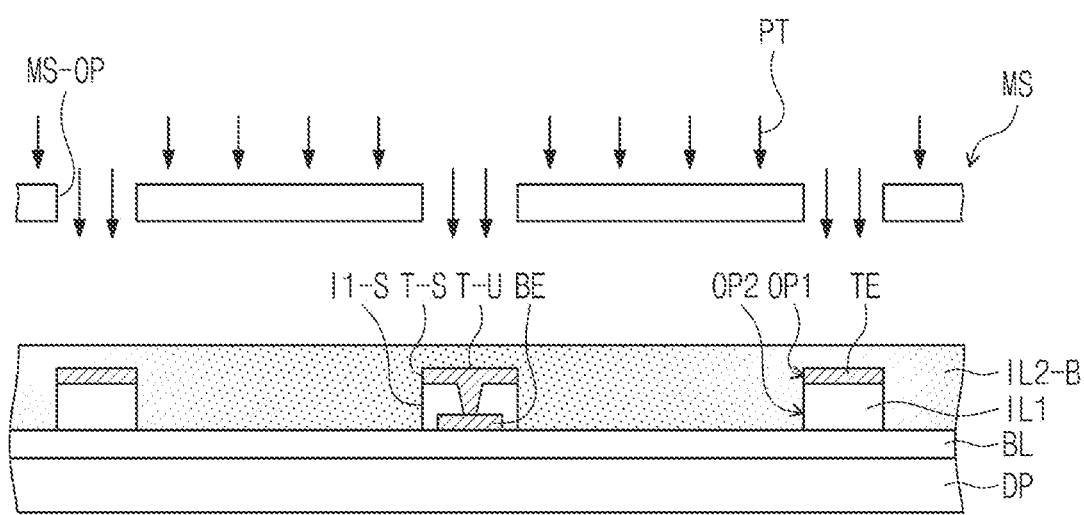
Figure 8G:
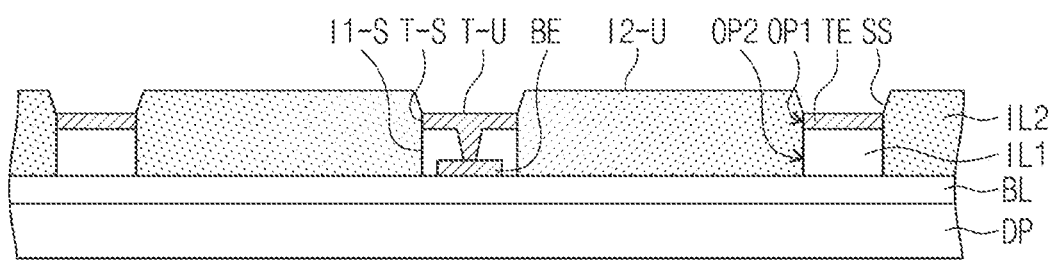

Referring to FIGS. 8F and 8G, a patterning process is performed on the second initial insulating layer IL2-B using a mask MS. The mask MS is provided with an opening MS-OP overlapping an upper surface T-U of the sensing electrode TE. In the process of irradiating the light PT to the second initial insulating layer IL2-B, an area of the second initial insulating layer IL2-B overlapping the upper surface T-U of the sensing electrode TE is exposed to the light.

The second initial insulating layer IL2-B is patterned through a development process, and a second insulating layer IL2 is formed into a plurality of patterns. Each of the patterns forming the second insulating layer IL2 is located inside the first opening OP1 and the second opening OP2. When viewed in a plane, each of the patterns of the second insulating layer IL2 is located in a corresponding mesh opening MSL-OP (refer to FIG. 5).

FIG. 8F shows the second initial insulating layer IL2-B that includes a positive type material as a representative example, however, it should not be limited thereto or thereby. As an example, the second initial insulating layer IL2-B may include a negative type material from which a portion that is not exposed to a light is removed, and in this case, the opening MS-OP of the mask MS may not overlap the upper surface T-U of the sensing electrode TE.

The upper surface T-U of the sensing electrode TE is exposed without being covered by the patterned second insulating layer IL2. The second insulating layer IL2 protrudes from the upper surface T-U of the sensing electrode TE and has a step difference with respect to the upper surface T-U of the sensing electrode TE.

FIG. 8G shows a structure in which a slant surface SS slanted with respect to the upper surface T-U of the sensing electrode TE defines the step difference, however, a shape of the step difference should not be limited thereto or thereby.

Figure 8H:
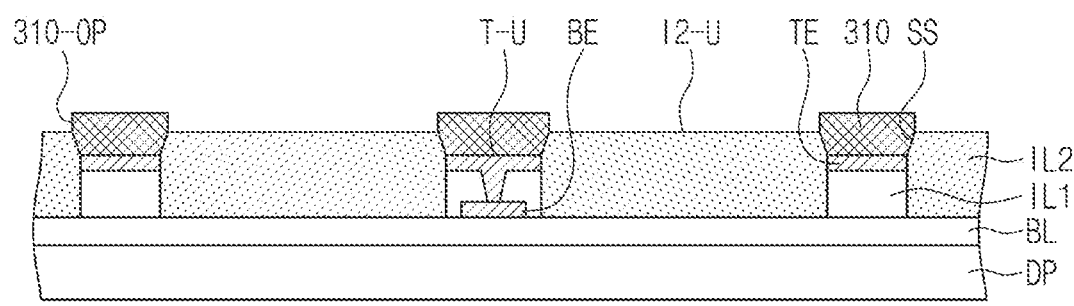

Then, as shown in FIG. 8H, a light blocking pattern 310 is formed on the upper surface T-U of the sensing electrode TE. According to some embodiments, the light blocking pattern 310 is formed by coating a light blocking material on the sensing electrode TE and the second insulating layer IL2 and patterning a layer formed by the coated light blocking material. In this case, a light blocking opening 310-OP may be defined through the light blocking pattern 310.

According to some embodiments, the light blocking pattern 310 covers the upper surface T-U of the sensing electrode TE and the slant surface SS of the second insulating layer IL2.

Figure 8I:
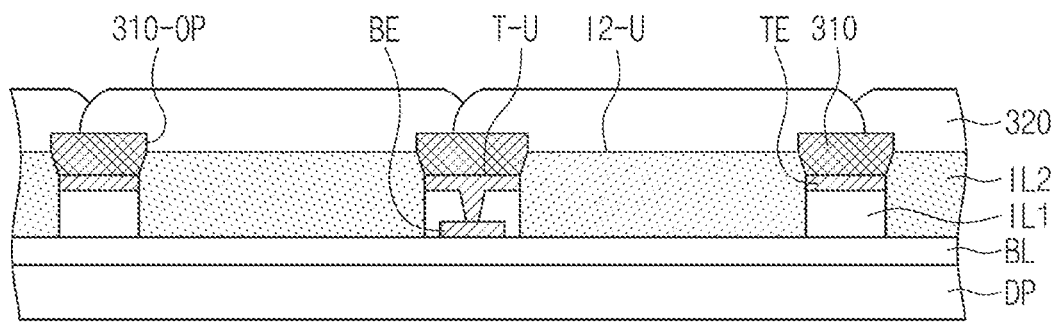

Referring to FIG. 8I, a color filter layer 320 is formed on the second insulating layer IL2. The color filter layer 320 includes a plurality of color filters adjacent to each other, e.g., a first color filter, a second color filter, and a third color filter, and is formed through a plurality of photolithography processes.

Figure 9A:
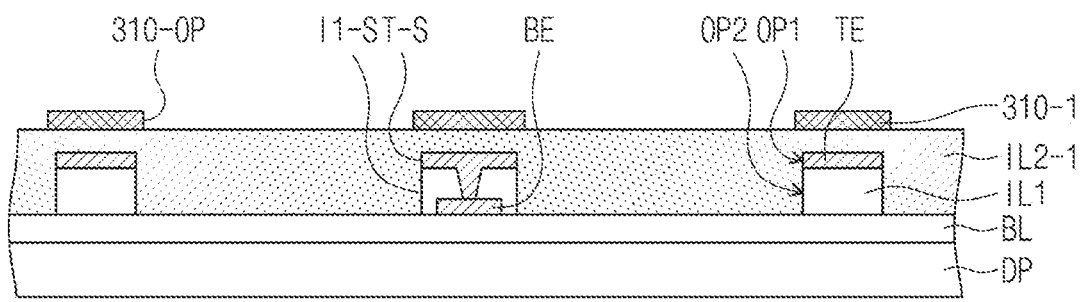
FIGS. 9A and 9B are cross-sectional views of a method of manufacturing a display device according to some embodiments of the present disclosure.
Figure 9B:
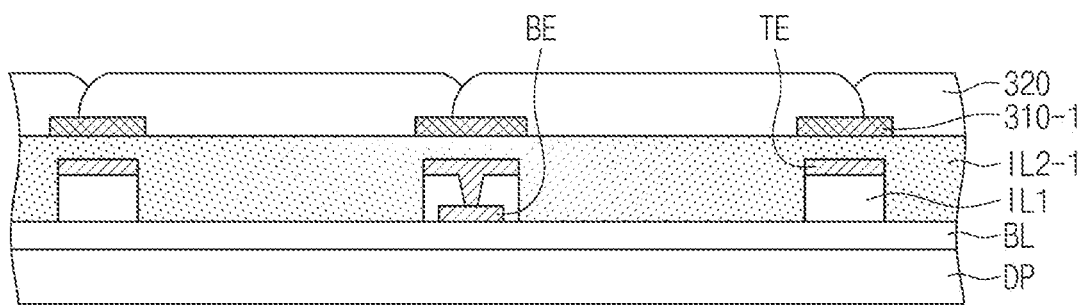

FIGS. 9A and 9B are cross-sectional views of a method of manufacturing the display device according to some embodiments of the present disclosure. FIG. 9A shows a manufacturing method of the second insulating layer IL2-1 shown in FIG. 7A, and FIG. 9B shows a manufacturing method of some components of the anti-reflective layer 300 on the second insulating layer IL2-1 shown in FIG. 7A.

The second insulating layer IL2-1 shown in FIG. 9A may correspond to the second initial insulating layer IL2-B described with reference to FIG. 8E. That is, the irradiation process of the light PT and the development process described with reference to FIGS. 8F and 8G are omitted with respect to the second insulating layer IL2-1 shown in FIG. 9A.

Accordingly, different from the second insulating layer IL2 described with reference to FIG. 8G, the second insulating layer IL2-1 according to some embodiments covers the upper surface T-U of the sensing electrode TE.

Then, as shown in FIG. 9B, a light blocking pattern 310-1 and a color filter layer 320 are formed on the second insulating layer IL2-1. Different from the light blocking pattern 310 described with reference to FIG. 8H, the light blocking pattern 310-1 is not in contact with the sensing electrode TE.

Figure 10A:
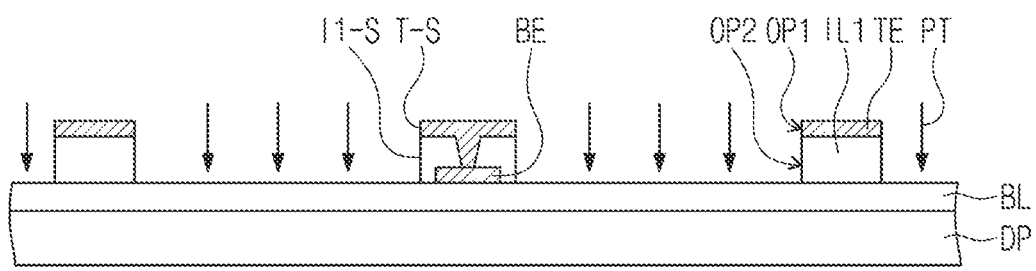
FIGS. 10A to 10C are cross-sectional views of a method of manufacturing a display device according to some embodiments of the present disclosure.
Figure 10B:
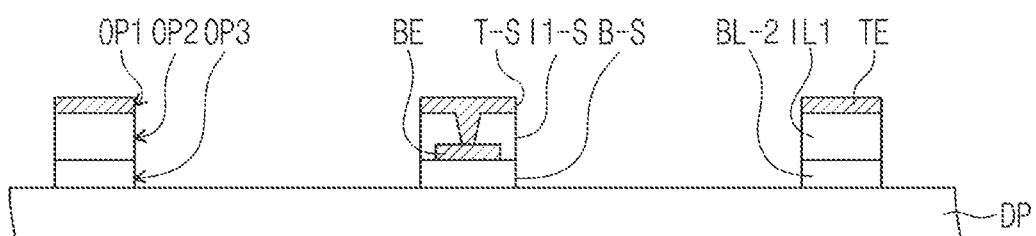
Figure 10C:
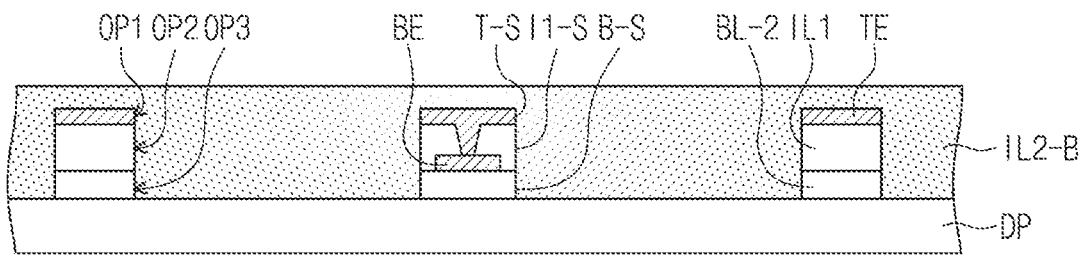

FIGS. 10A to 10C are cross-sectional views of a method of manufacturing the display device according to some embodiments of the present disclosure. FIGS. 10A to 10C show a manufacturing method of the lower insulating layer BL-2 described with reference to FIG. 7B. Accordingly, FIGS. 10A and 10B show additional processes after the process of irradiating the light to the first initial insulating layer IL1-B using the sensing electrode TE as the mask and the process of patterning the first insulating layer IL1 through the development process described with reference to FIGS. 8C and 8D.

Referring to FIG. 10A, a light PT is irradiated to an initial lower insulating layer BL using the sensing electrode TE as the mask. The initial lower insulating layer BL of FIG. 10A may correspond to the lower insulating layer BL-2 of FIG. 7B. According to some embodiments, the initial lower insulating layer BL may include a positive type material.

Referring to FIG. 10B, a third opening OP3 is formed through the initial lower insulating layer BL. A portion of the initial lower insulating layer BL, which overlaps a first opening OP1 and a second opening OP2, is exposed to the light and removed, and thus, the third opening OP3 is defined to overlap the first opening OP1 and the second opening OP2.

That is, the third opening OP3, the first opening OP1, and the second opening OP2 defined through the lower insulating layer BL-2 have the same shape (or substantially the same shape) as each other. Accordingly, a side surface B-S of the lower insulating layer BL-2, a side surface T-S of the sensing electrode TE, and a side surface I1-S of the first insulating layer IL1 may be aligned with each other.

Referring to FIG. 10C, a second initial insulating layer IL2-B is formed on a display panel DP. The second initial insulating layer IL2-B is located inside the first opening OP1 to the third opening OP3.

Then, the processes shown in FIGS. 8F to 8I are performed in the same manner. According to some embodiments, the second insulating layer IL2 according to some embodiments is located inside the first opening OP1 to the third opening OP3.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims, and their equivalent.

What is claimed is:

1. A display device comprising:
a display panel comprising a light emitting area and a non-light-emitting area;
an input sensor on the display panel; and
an anti-reflective layer on the input sensor, the input sensor comprising:
a sensing electrode on the display panel and having a first opening defined therethrough to correspond to the light emitting area;
a first insulating layer between the sensing electrode and the display panel and having a second opening defined therethrough to correspond to the first opening; and
a second insulating layer comprising a first portion inside at least the first opening and the second opening, wherein one of the first insulating layer and the second insulating layer comprises an organic material, the other of the first insulating layer and the second insulating layer comprises an inorganic material, and the first opening has a substantially same shape as the second opening in a plan view.

2. The display device of claim 1, wherein an upper surface of the second insulating layer protrudes from an upper surface of the sensing electrode to form a step difference with the upper surface of the sensing electrode.

3. The display device of claim 2, further comprising a light blocking pattern that covers the step difference and is in contact with the sensing electrode.

4. The display device of claim 1, further comprising a color filter layer on an upper surface of the second insulating layer and overlapping the light emitting area and the non-light-emitting area.

5. The display device of claim 1, wherein the second insulating layer further comprises a second portion extending from the first portion and overlapping the light emitting area and the non-light-emitting area.

6. The display device of claim 5, wherein the second portion of the second insulating layer covers the sensing electrode.

7. The display device of claim 5, further comprising a color filter layer on the second insulating layer.

8. The display device of claim 1, further comprising a lower insulating layer between the display panel and the first and second insulating layers and overlapping the light emitting area and the non-light-emitting area.

9. The display device of claim 8, further comprising a bridge electrode between the lower insulating layer and the first insulating layer, wherein the bridge electrode is connected to the sensing electrode via a contact hole defined through the first insulating layer.

10. The display device of claim 1, further comprising a lower insulating layer between the display panel and the first insulating layer and provided with a third opening defined therethrough and extending from the second opening.

11. The display device of claim 1, wherein a side surface of the sensing electrode is aligned with a side surface of the first insulating layer.

12. The display device of claim 1, wherein the sensing electrode has a mesh shape in the plan view.

13. The display device of claim 1, wherein the display panel comprises:
a light emitting element comprising a first electrode, a light emitting layer on the first electrode, and a second electrode on the light emitting layer;
a pixel definition layer having a pixel opening defined therethrough to expose the first electrode; and
an encapsulation layer on the pixel definition layer and encapsulating the light emitting element, and the light emitting opening defines the light emitting area.

14. A method of manufacturing a display device, comprising:
forming a first insulating layer on a display panel comprising a light emitting area and a non-light-emitting area;
forming a sensing electrode having a first opening defined therethrough on the first insulating layer;
forming a second opening having a same shape as the first opening in a plan view through the first insulating layer using the sensing electrode as a mask;
forming a second insulating layer comprising a first portion inside at least the first and second openings; and
forming a color filter layer on the second insulating layer to overlap the light emitting area and the non-light-emitting area, wherein one of the first insulating layer and the second insulating layer comprises an organic material, and the other of the first insulating layer and the second insulating layer comprises an inorganic material.

15. The method of claim 14, wherein the forming of the second insulating layer comprises:
forming the second insulating layer to cover the sensing electrode and the first insulating layer; and
patterning the second insulating layer to expose an upper surface of the sensing electrode without being covered by the second insulating layer.

16. The method of claim 14, further comprising forming a light blocking pattern to overlap an upper surface of the sensing electrode after the forming of the second insulating layer and before the forming of the color filter layer.

17. The method of claim 14, wherein the second insulating layer further comprises a second portion extending from the first portion and overlapping the light emitting area and the non-light-emitting area, and the forming of the second insulating layer comprises depositing an insulating material.

18. The method of claim 14, further comprising forming a lower insulating layer overlapping the light emitting area and the non-light-emitting area before the forming of the first insulating layer.

19. The method of claim 18, further comprising forming a third opening through the lower insulating layer and extending from the second opening after the forming of the second opening through the first insulating layer.

20. The method of claim 14, wherein a side surface of the first insulating layer is aligned with a side surface of the sensing electrode.

* * * * *